United States Patent [19]
Mizoguchi et al.

[11] Patent Number: 6,008,497
[45] Date of Patent: Dec. 28, 1999

[54] LASER APPARTUS

[75] Inventors: Hakaru Mizoguchi, Hiratsuka; Osamu Wakabayashi, Oyama; Yukio Kobayashi, Oyama; Yoshiho Amada, Oyama; Tatsuo Mimura, Hiratsuka, all of Japan

[73] Assignee: Komatsu Ltd., Tokyo, Japan

[21] Appl. No.: 09/029,218

[22] PCT Filed: Sep. 27, 1996

[86] PCT No.: PCT/JP96/02820

§ 371 Date: Feb. 25, 1998

§ 102(e) Date: Feb. 25, 1998

[87] PCT Pub. No.: WO97/11810

PCT Pub. Date: Apr. 3, 1997

[30] Foreign Application Priority Data

Sep. 27, 1995 [JP] Japan .................................... 7-249683
Mar. 14, 1996 [JP] Japan .................................... 8-057783

[51] Int. Cl.[6] .................................................. B23K 26/00
[52] U.S. Cl. .......................................... 250/492.1; 362/259
[58] Field of Search .......................... 250/492.1; 362/259

[56] References Cited

U.S. PATENT DOCUMENTS 4,302,782 11/1981 Gunning et al. ........................ 358/296

OTHER PUBLICATIONS

"Advanced Krypton Fluoride Excimer Laser for Microlithography" by Ishihara et al., in SPIE vol. 1674.
Optical/Laser Microlithography V (1992), pp. 437–485 and including cover page, copyright page & Table of Contents iii–viii.

Primary Examiner—Kiet T. Nguyen
Attorney, Agent, or Firm—Varndell & Varndell, PLLC

[57] ABSTRACT

A laser apparatus comprises storage means for storing a power source voltage of each pulse at the time of continuous pulse oscillation for one cycle, with each voltage correlated with an identifier which specifies the respective pulse, and output control means for, when a pulse is generated, reading from the storage means the source voltage of a pulse having the same identifier, and performing pulse oscillation on the basis of the source voltage. Thus the influence of the spiking phenomenon during a burst mode operation is eliminated as much as possible, and thereby the accuracy of laser beam machining is still more improved.

10 Claims, 24 Drawing Sheets

LASER APPARTUS

TECHNICAL FIELD

The present invention relates to a laser apparatus to output a laser beam for a machining apparatus to apply prescribed machining, using a laser beam, to semiconductors, polymer materials, or inorganic materials and particularly to an improvement to attain uniform pulse energy values continuously, when effecting burst mode operation, which is switching alternately between a continuous oscillation action for continuous pulse oscillation of a laser beam at a prescribed frequency and a stopping action for stopping the pulse oscillation for a prescribed time, and an improvement to make uniform the shifting cumulative exposure when effecting machining with a step and scan system.

BACKGROUND ART

In the field of microfinishing using ultraviolet light, such as with semiconductor exposure apparatuses, strict exposure control is necessary in order to maintain the resolution of the circuit pattern at a constant level or better. However, excimer lasers used as the light source in semiconductor exposure apparatuses have variations in the pulse energy of each pulse since these lasers are so-called pulse excitation gas discharge lasers. It is necessary to reduce these variations in order to improve the precision of exposure control.

Therefore, a method for decreasing the variation in the cumulative value of the irradiated energy, by decreasing the light energy output with one pulse oscillation and irradiating the same location to be machined with a plurality of successive pulses, is being considered.

In consideration of production, however, a large number of pulses is not preferable. Also, in the field of semiconductor exposure, the sensitivity of photosensitive materials applied to wafers has improved in recent years and exposure with a small number of pulses is becoming possible. For this reason, a method to increase the number of pulses and reduce variations in total energy of the irradiated light is unavoidable.

However, semiconductor exposure apparatuses repeatedly alternate between exposure and stepped movement. Therefore, the operating state of the excimer laser, the light source, as shown in FIG. 23, necessarily becomes the burst mode of switching between the action of continuous pulse oscillation to oscillate the laser beam continuously at a fixed frequency, and the action of stopping the pulse oscillation for a prescribed time. In effect, the burst mode switches alternately between the continuous pulse oscillation period and the oscillation stoppage period. In effect, in FIG. 23, one IC chip formed on a semiconductor wafer undergoes machining with a pulse group constituting a single continuous pulse oscillation period. Moreover, FIG. 23 shows the energy intensity of each pulse when the excitation intensity (charging voltage) is set at a constant value.

As discussed above, since the excimer laser is a pulse excitation gas discharge laser, it is difficult for it to continuously oscillate at a pulse energy of a constant size. The cause of this is as follows: the discharge disturbs the density of the laser gas within the discharge space, making the next discharge irregular and unstable; because of this irregular discharge, etc., a localized temperature increase occurs on the surface of the discharge electrode, deteriorating the next discharge; and discharge becomes irregular and unstable.

In particular, that trend is marked in the initial phase of the continuous pulse oscillation period; the so-called spiking phenomenon appears as shown in FIGS. 23 and 24. In the spiking phenomenon, a comparatively high pulse energy is attained initially in the spike zone, including the first few pulses after the oscillation stoppage period t, and afterwards pulse energy gradually decreases. When this spike zone is finished, the pulse energy passes through a plateau zone where a stable value at a comparatively high level is maintained, and then enters a stable zone (stationary zone).

This type of excimer laser apparatus with a burst mode operation has such problems as variations in the energy of each pulse, discussed above, decreasing the precision of exposure control, and the spiking phenomenon markedly enlarging the variations further and greatly reducing the precision of exposure control.

Moreover, in recent years, the sensitivity of photosensitive materials applied to wafers has increased, as discussed above, making possible exposure with a small number of continuous pulses; the trend is for a reduced number of pulses. However, variations in pulse energy have accordingly increased as the number of pulses has decreased. It has become difficult to sustain the precision of exposure control through only the multiple pulse exposure control discussed above (control by reducing the amount of energy output in a single pulse oscillation and irradiating the same location to be machined with a plurality of successive pulses).

Therefore, the present applicant is applying for patents for various inventions using the property that pulse energy increases as excitation intensity (charging voltage) increases and relating to so-called spiking prevention control, to prevent the initial energy increase due to the spiking phenomenon, by changing the discharge voltage (charging voltage) for each pulse, through reducing the discharge voltage (charging voltage) of the initial pulse in continuous pulse oscillation in burst mode and gradually increasing the discharge pulse (charging voltage) of subsequent pulses, as shown in FIG. 25 (Japanese Patent Application No. 4-191056, Japanese Patent Application Laid-open No. 7-106678 (Japanese Patent Application No. 5-249483), etc.).

Specifically, FIG. 26 shows the energy intensity of each pulse in the case of excitation intensity (charging voltage) being fixed at a constant value, as shown in FIG. 23 or 24 noted above. A spiking phenomenon is exhibited wherein a comparatively high pulse energy is attained initially at a constant state of excitation intensity and pulse energy gradually decreases thereafter.

FIG. 25 shows an excitation intensity pattern in the case of the spiking phenomenon occurring as shown in FIG. 26. The excitation intensity pattern shows the excitation intensity displacement to correct the increased energy of the initial pulse in the spiking phenomenon and attain a constant pulse energy value. This instance shows the excitation intensity pattern with pulse energy conversion. In other words, because pulse energy is high for the first few pulses in the spiking phenomenon as shown in FIG. 25, the excitation intensity is reduced for the first few pulses in continuous pulse oscillation, and then the excitation intensity is gradually increased. In this way, during pulse oscillation, the source voltage is applied according to this excitation intensity pattern for each pulse oscillation. This prevents the initial rise in pulse energy due to the spiking phenomenon and controls so that the pulse energy of each pulse is the same for all pulses.

This background art has source voltage data to set the energy of each pulse in continuous pulse oscillation to a desired target value (constant value), in view of various parameters such as the oscillation stoppage time t (See FIG.

23) and power lock voltage (source voltage determined according to the deterioration of laser gas), stored in memory in advance for each pulse in continuous pulse oscillation. Meanwhile, this background art detects the pulse energy during continuous pulse oscillation conducted up to the previous time, compares this detected value and the pulse energy target value, and corrects the previously stored source voltage data corresponding to each pulse based on the results of this comparison. This correction is called spike killer control.

However, this background art gives rise to the following problems; the measures to prevent the spiking phenomenon are not necessarily sufficient.

The problems are explained using FIG. 27.

FIG. 27 shows the pulse waveform during burst mode operation in semiconductor exposure. In the figure, No. 1, No. 2, ... No. j, ... No. N are pulse groups. Each pulse group is constituted of a prescribed number of continuous pulses as shown in FIGS. 23, 24, and 26. A short laser oscillation stoppage time $\Delta Tj$ appears between No. j and No. j+1. A long laser oscillation stoppage time $\Delta T$ appears after the No. N pulse group.

This type of arrangement of pulse groups derives from semiconductor exposure being conducted while the process alternates between exposure of the chip on the wafer and movement of the optical system. Specifically, the action of exposing one particular chip on a wafer is conducted with the No. j pulse group and the action of exposing the next chip is conducted with the No. j+1 pulse group. The time necessary for exposure and movement the optical system is $\Delta Tj$. The exposure of a single wafer is entirely finished at the time when the switching between this exposure and movement of the optical system and the oscillation of the series of pulse groups from No. 1 to No. N is completed. Here, $\Delta T$ is the time in which the exposed wafer is transported out and the next wafer is transported into the exposure apparatus and aligned in a position where exposure is possible. After this $\Delta T$, the series of pulse groups No. 1', No. 2', ... No. j', ... No. N', which is the same as No. 1 to No. N, continues.

In the case of the laser operation discussed above, the excitation intensity pattern of the No. 1 pulse group, which is directly preceded by the same laser oscillation stoppage time ($\Delta T$ in this case), is used in the oscillation of the next No. 1' pulse group after $\Delta T$ following the completion of No. N, in order to suppress the spiking phenomenon occurring in each pulse group. Also, the excitation intensity pattern of the No. N pulse group, which is directly preceded by the same laser oscillation stoppage time, is used for the No. 2' to No. N' pulse groups ($\Delta T$ to $\Delta TN-1$ is the same length of time). In other words, the data for the previous pulse group No. 1 is used for the initial pulse group No. 1' since the influence of the spiking phenomenon is marked, but because the influence of the spiking phenomenon gradually decreases, the No. N pulse group data is used for the pulse groups No. 2' and later for simple control.

The influence of the spiking phenomenon in each pulse group is suppressed to a certain extent. However, the experiments of the present inventors show that the variations in pulse energy are not necessarily resolved due to the cause discussed below and the effect of the suppression is not stable.

The cause is that the spiking phenomenon is influenced by the hysteresis of prior pulse oscillation. In other words, the spiking phenomenon has the property of becoming more marked when the laser oscillation stoppage time in burst mode is greater. Therefore, the following phenomenon occurs: the suppression of the spiking phenomenon easily becomes insufficient in the first half, No. 1', No. 2'..., of the series of pulse groups No. 1' to No. N' following No. 1 to No. N in FIG. 27, and the effects of suppressing the spiking phenomenon are sufficiently displayed in the second half of the pulse groups, ... No. N'-2, No. N'-1, No. N'. In this way, the excitation intensity pattern of a pulse group is different depending on where the pulse group falls within the series of pulse groups. The suppression of the spiking phenomenon does not take effect even with the application of data for a pulse group directly preceded by the same laser oscillation stoppage time.

Consequently, because pulse oscillation is controlled using the preceding excitation intensity pattern, variations in pulse energy are not resolved with a conventional laser apparatus as represented in the Japanese Patent Application No. 4-191056 and suppression of the spiking phenomenon is still desirable.

Also, with the background art, the suppression of variations in pulse energy is insufficient in zones other than the spike zone, since spike killer control is performed in the plateau zone and stable zone as well as in the spike zone shown in FIG. 24. Moreover, the suppression of pulse energy is insufficient even when spike killer control is performed only in the spike zone and plateau zone.

This is thought to be due to the following: the influence of the laser oscillation stoppage (laser is stabilized) remains strong in the initial period of continuous pulse and the output power becomes high compared to other zones even if the same source voltage is impressed; and in the subsequent plateau zone and stable zone, the influence of laser oscillation stoppage decreases, while the influence of pulse oscillation (increased electrode temperature, turbulence of laser gas, etc.) is even stronger.

Also, with the background art, the amount of data stored to effect spike killer control for all pulses in continuous pulse oscillation becomes great. This gives rise to the following problems: a large memory capacity and time to read data from memory are required.

However, as memory capacity is increased, the exposure system for apparatuses for exposing semiconductors will change from a stepper system, for stopping the stage and effecting exposure, to a step and scan system, for effecting exposure while moving the stage. The advantage of this step and scan system is that large areas can be exposed. For example, when using a lens with a field size of 36 mm, the exposed area is a 25 mm square in the stepper system, but the step and scan system makes possible the exposure of a large area of 30×40 mm. In the future, chip sizes will increase as the degree of integration increases and high precision exposure with the step and scan system will be desired.

In other words, with the step and scan system, machining is effected while zones irradiated by pulse laser beams on a machined item are staggered at a prescribed pitch each time a pulse laser is radiated, so that a prescribed number NO of pulse lasers, each established in advance, irradiate all points on the machined item. In this step and scan system, however, it is difficult to effect control in such a manner that the exposure of each point on a machined item is the same because the pulse laser beam is scanned continuously. Therefore, an effective control method is desirable.

It is an object of the present invention to provide a laser apparatus, being a laser apparatus operated in the burst mode, wherein the influence of the spiking phenomenon is eliminated as much as possible, so as to further improve the precision of machining with a laser beam.

Also, it is an object of the present invention to provide a laser apparatus which can make uniform the exposure of each point on a machined item in the case of effecting machining with the step and scan system.

DISCLOSURE OF THE INVENTION

The present invention provides a laser apparatus which effects a burst mode operation having as one cycle an operation of switching at a prescribed frequency between a continuous oscillation action for continuous pulse oscillation of a laser beam at a prescribed frequency and a stoppage action for stopping the pulse oscillation for a prescribed time, and controls a source voltage in such a manner that an energy output in the pulse oscillation reaches a prescribed magnitude, characterized in that the apparatus comprises:

storage means for storing the source voltage of each pulse when effecting the continuous pulse oscillation in association with identifiers specific to each pulse for one cycle's worth; and output control means, when oscillating one pulse, for reading out a source voltage of a pulse having the same identifier as that one pulse from the storage means and effecting the pulse oscillation based on the read-out source voltage.

With such an invention, at the time of oscillation of one pulse during continuous pulse oscillation, source voltage of a pulse having the same identifier as that pulse is read from the means for storing and pulse oscillation is effected on the basis of this source voltage. Therefore, in the case where all pulse oscillation for one machined item is completed with one cycle of burst mode operation, the read source voltage is data from pulse oscillation at the same position on the previous machined item; that data has an excitation intensity pattern influenced by a series of continuous pulse oscillations. In other words, during pulse oscillation, variations of the pulse energy can be more finely corrected since source voltage having an excitation intensity pattern with the same properties as the previous time is applied.

Therefore, the precision of machining with laser beams can be further improved since the influence of the spiking phenomenon during burst mode operation can be eliminated as much as possible.

Also, the invention provides a laser apparatus which effects a burst mode operation having as one burst cycle an operation of switching at a prescribed frequency between a continuous oscillation action for continuous pulse oscillation of a laser beam at a prescribed frequency and a stoppage action for stopping the pulse oscillation for a prescribed time, and controls an excitation intensity of the laser in such a manner that an energy output in the pulse oscillation reaches a prescribed magnitude, characterized in that the apparatus comprises:

storing means for storing a source voltage at a time of each pulse oscillation, in correlation to an oscillation stoppage time, a pulse order within one burst cycle, and a monitor value of an output pulse energy, with respect to each of a prescribed number of initial pulses when effecting the continuous oscillation action, and storing an excitation intensity during each pulse oscillation in correlation to a monitor value of the output pulse energy, with respect to each pulse generated after the prescribed number of initial pulses;

first source voltage control means which makes a reading of at least one set of a monitor value of an output pulse energy approaching a target pulse energy of the current pulse oscillation and an excitation intensity of that pulse, where the oscillation stoppage time and the pulse order within one burst cycle are the same, from among data of past pulse oscillations stored in the storage means, with respect to each of the prescribed number of initial pulses when effecting the continuous pulse oscillation, calculates an excitation intensity during the current pulse oscillation based on the read value, and effects the pulse oscillation based on the calculated excitation intensity value; and second source voltage control means which makes a reading of a pulse energy monitor value of a pulse already output within the current burst period and the excitation intensity of that pulse, from the storage means, with respect to each pulse generated after the prescribed number of initial pulses when effecting the continuous pulse oscillation, calculates an excitation intensity during the current pulse oscillation based on these values, and effects the pulse oscillation based on the calculated excitation intensity.

Such an invention is constituted so as to effect a type of spike killer control in the spike zone including a prescribed number of initial pulses by making a reading of at least one set of a monitor value of output pulse energy approaching target pulse energy of the current pulse oscillation and the excitation intensity of that pulse, where oscillation stoppage time and pulse order within one burst cycle are the same, from among stored data of past pulse oscillation stored in the means for storing; calculating excitation intensity during the current pulse oscillation based on this read value; and effecting pulse oscillation based on the calculated value of excitation intensity; and so as to effect source voltage control in zones subsequent to the spike zone by reading the pulse energy monitor value of a pulse already output in the current burst cycle and the value of the excitation intensity at that time, calculating the excitation intensity value at the time of the current pulse oscillation based on these values, and effecting pulse oscillation based on this excitation intensity.

In other words, the present invention effects spike killer control in the spike zone, since the influence of the laser oscillation stoppage remains strong, and effects source voltage control (pulse energy control within the burst) according to the situation of the preceding pulse oscillation (output power correlating to impressed source voltage) in subsequent zones, since these are strongly affected by the influence of preceding pulses.

Also, the present invention provides a laser apparatus which continuously outputs a prescribed number Nt (NO<Nt) only of pulse laser beams necessary for machining an object to be machined, for a machining apparatus to effect machining while an irradiation zone of a pulse laser beam on the object is displaced by a prescribed pitch each time a pulse laser is irradiated, so that a preset, prescribed number NO of pulse lasers are irradiated onto all points on the object, characterized in that the apparatus comprises:

pulse energy detecting means for detecting a pulse energy $Pk$ ($k=1, 2, \ldots, Nt$) of an output pulse laser beam whenever each pulse laser beam is oscillated; and target pulse energy revising means, when a set target value of each pulse laser is $Pd$ and an order of pulse laser beams output continuously is $i$, for calculating a target energy $Pt$ at a time when each of the pulse laser beams is oscillated according to the following formula, changing the calculated target energy $Pt$ to the set target value $Pd$ and outputting that value, whenever each of the pulse laser beams is oscillated, in the case where $i=1$, $Pt=Pd$ in the case where i≦NO, $$Pt = Pd \times i - \sum_{k=1}^{i-1} Pk$$

in the case where $i > NO$ $$Pt = Pd \times NO - \sum_{k=i-NO+1}^{i} Pk$$

With such an invention, the real exposure from preceding pulse laser beams is subtracted from the ideal value of exposure at each time and at each point on the machined object, in the step and scan system, and this remainder is used as the target value of pulse energy during the current laser pulse oscillation.

Furthermore, the present invention provides a laser apparatus which continuously outputs a pulse laser beam for a machining apparatus to effect a prescribed machining by irradiating a preset, prescribed number NO of pulse lasers to an object to be machined with an irradiation zone of the pulse laser beams being fixed, characterized in that the apparatus comprises:

pulse energy detecting means for detecting an energy Pk (k=1, 2, . . . , No) of an output pulse laser beam whenever each laser beam is oscillated; and target pulse energy revising means, when a set target value of each pulse laser is Pd and an order of pulse laser beams output continuously is i, for calculating a target energy Pt at a time when each of the pulse laser beams is oscillated according to the following formula, changing the calculated target energy Pt to the set target value Pd and outputting that value, whenever each of the pulse laser beams is oscillated, in the case where i=1, Pt=Pd
in the case where i>1, $$Pt = Pd \times i - \sum_{k=1}^{i-1} Pk$$

With such an invention, the real exposure from preceding pulse laser beams is subtracted from the ideal value of exposure at each time, in the stepper system, and this remainder is used as the target value of pulse energy during the current laser pulse oscillation.

BEST MODE FOR CARRYING OUT THE INVENTION

Below, the laser apparatus relating to the present invention is explained for the embodiments in the case where the laser apparatus of the present invention is applied to a semiconductor exposure apparatus using an excimer laser.

Figure 1:
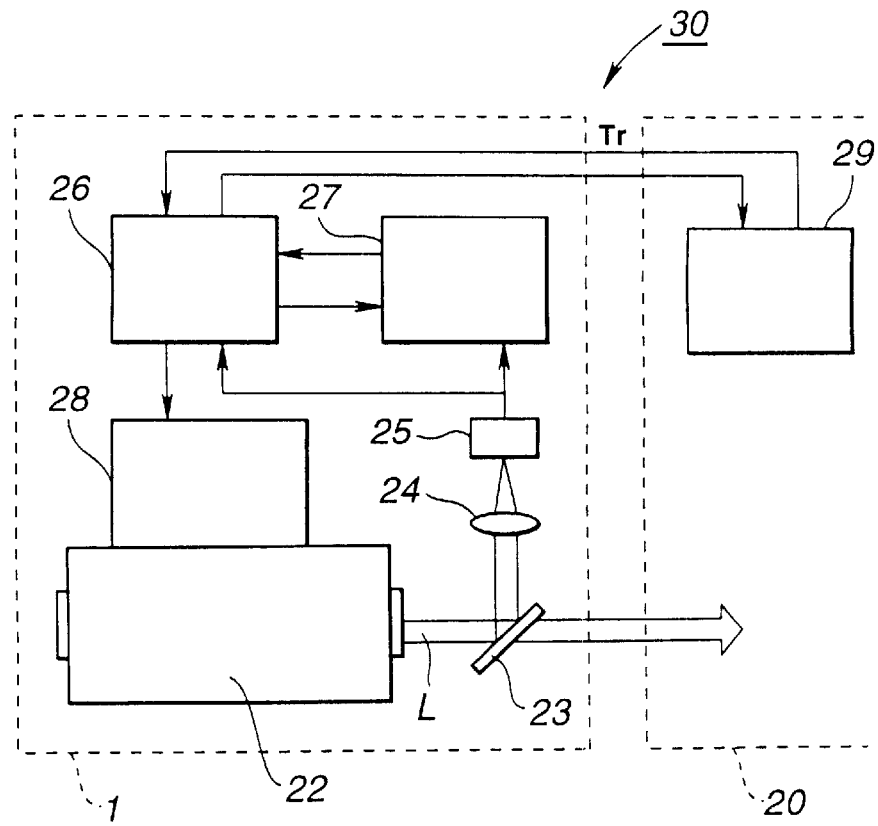
FIG. 1 is a block diagram to show the functional constitution of a semiconductor exposure apparatus relating to an embodiment.

FIG. 1 is a block diagram to show the functional constitution of the semiconductor exposure apparatus 30 in the present embodiment. As shown in this figure, the semiconductor exposure apparatus 30, generally speaking, is constituted of a laser apparatus 1 to output an excimer laser beam L (below, laser beam L) and an exposure apparatus body 20 to effect reduction projection exposure with the laser beam L with this laser apparatus 1 as a light source.

A laser oscillator 22 of the laser apparatus 1 comprises a laser chamber and an optical resonator; the laser chamber is filled with a laser gas such as Kr and F2 or Ar and F2, Xe and C12, etc. Discharge is effected between electrodes, not pictured, installed above and below the laser chamber, the laser gas is excited, and laser oscillation effected. The oscillated laser beam resonates within the optical resonator and is output as the laser beam L. Moreover, the discharge is effected during a prescribed interval in the prescribed pulse duration; the laser beam L is output intermittently.

The laser beam L oscillated from the laser oscillator 22 in this way is partially sampled with a beam splitter 23 and radiated to an output monitor 25 a via lens 24. The energy (below, pulse energy) Pi (i=1, 2, 3, ... ) per one pulse of the laser beam L is detected with this output monitor 25. The pulse energy Pi detected with the output monitor 25 is sent to an output control portion 26 and is stored in a table as the pulse energy Pj,i of the i-th in the pulse group No. j as discussed below.

The output control portion 26 is connected with a signal line to an exposure apparatus control portion 29 within the exposure apparatus body 20. Upon receiving a trigger signal Tr output from the exposure apparatus control portion 29, the output control portion 26 reads the source voltage stored in the table discussed below and provides the voltage data based thereon to the laser power source 28. The laser power source 28 controls the source voltage Vi (i=1, 2, 3, ... ) according to the voltage data given.

Also, the output control portion 26 include s a timer means which is not shown. With this timer means, the output control portion 26 measures in sequence the reception time for the trigger signal TR which is sent thereto. Thus, as discussed below, the output control portion 26 determines which time corresponds to the laser oscillation stoppage time according to this reception interval time and controls pulse oscillation.

The control portion 27 is the portion to effect calculations necessary for the action of the laser apparatus 1. At the time of each pulse oscillation, the detection results Pi from the output monitor 25 are sent to this control portion 27 as well and stored as the pulse energy Prj,i of a pulse which was really oscillated. In other words, the control portion 17 compares the Prj,i with the Pj,i stored in a table of the output control portion 16, whenever pulse oscillation is effected. When the difference exceeds the prescribed error range, the control portion 17 directs the renewal of the source voltage values stored in the output control portion 26.

Next, the action of the control portion 27 is explained, along with a more detailed explanation of the constitution of the output control portion 26 discussed above.

The output control portion 26 correlates the source voltage Vj,i of pulse No. j,i and the value of the pulse energy Pj,i at that time to the parameter j,i (j=1 to N, i=1 to n), which is the identifier of each pulse, and stores this as characteristic data when all chips on a wafer have been exposed.

Figure 27:
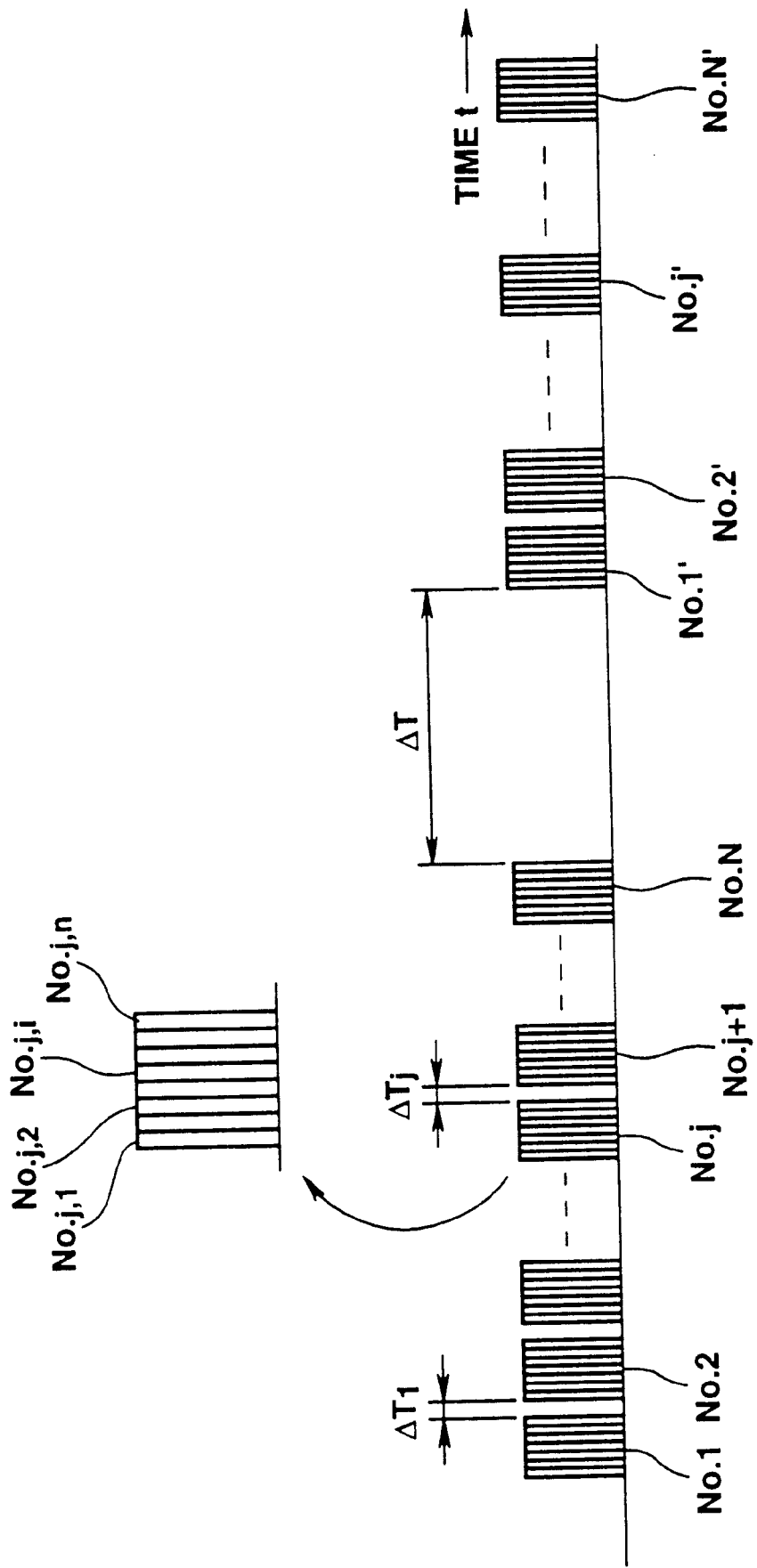
FIG. 27 is an explanatory diagram to show a pulse waveform during burst mode operation.

Here, the characteristic data are explained. Moreover, this presupposes the case of effecting burst mode operation as shown in FIG. 27 before. Also, the continuous pulse groups in order are No. 1, No. 2, ..., No. j, ... No. N and the pulses within the pulse group No. j in order are No. j, 1, No. j, 2, ..., No. j,i, ... No. j,n.

The relationship between the pulse energy Pj,i and the source voltage Vj,i of the initial pulses in the pulse group to suppress the spiking phenomenon differs with respect to the value of the parameter j, even if the parameter i is the same, as discussed before. These data are stored in a table and can be rewritten. In the output control portion 26, appropriate data are revised according to directions from the control portion 27 as discussed below.

As shown in FIG. 27, when burst mode operation is effected, a long laser oscillation stoppage time ΔT is followed again by regular repetition of alternating between continuous oscillation of a pulse group and a short oscillation stoppage time. Therefore the Vj,i stored in the table is read, as j and i are the parameters of the pulse to be oscillated, and this value is supplied to the laser power source 28 as voltage data. In this way, the source voltage, having the excitation pattern for chips on the previous exposed wafer and in the same positions as chips on the wafer to be exposed at the present time, is read and pulse oscillation is effected based on this source voltage. Therefore, the variations of pulse energy can be more finely corrected tan before, when using the data for a pulse group for which the preceding laser oscillation stoppage time is the same.

Moreover, in order to find the characteristics of the laser beam in advance, a trial burst mode operation with the timing shown in FIG. 27 is effected initially for the apparatus of the present embodiment. The source voltage Vj,i attained at this time and the value of the pulse energy Pj,i are stored as characteristic data. Moreover, the data from another apparatus may be read in and a trial operation not performed.

Meanwhile, concurrent with such control by the output control portion 26, real pulse energy Prj,i oscillated from the laser oscillator 22 is input to the control portion 27 from the output monitor 25 and the value at that time is compared with the Pj,i, which is stored in the table in the output control portion 26. When the difference between both exceeds the prescribed value, the output control portion 26 is instructed to revise the value of Vj,i.

In other words, when the target value of the pulse energy E of one pulse is Ed and the difference between the upper and lower limits of the error range, with this value of Ed as the center, is AE, the control portion 27 reads Pj,i from the table in the output control portion 26, compares this to the Prj,i which was input, determines whether the absolute value of Pj,i-Prj,i exceeds the following range:

Ed−ΔE/2≦|Pj,i−Prj,i|≦Ed+ΔE/2 and sends the results of the determination to the output control portion 26. The output control portion 26 revises the value of Vj,i in the table according to the results of the determination which were input. In this way, the pulse energy level can be controlled with good precision over a long period of time.

Figure 2A:
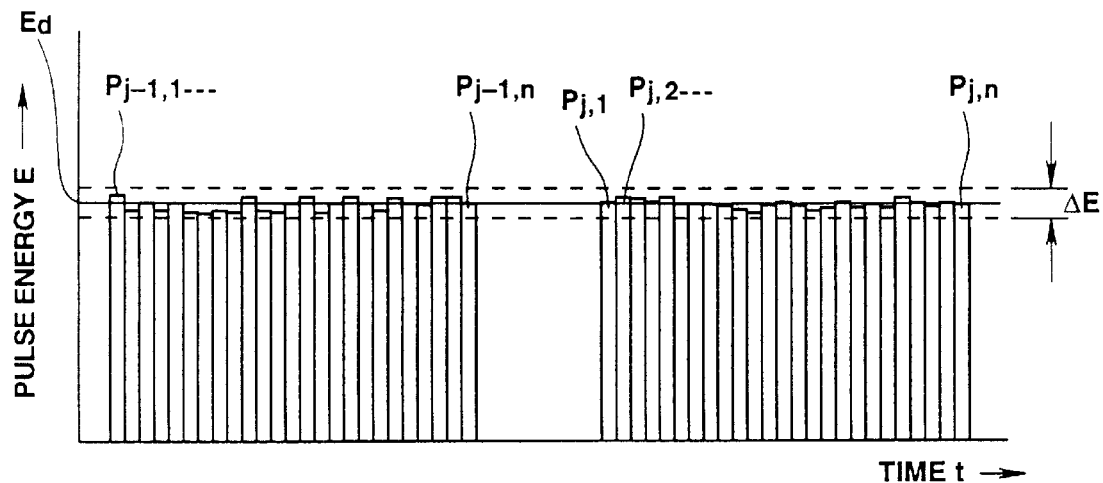
FIGS. 2(a) and 2(b) are explanatory diagrams to show the relationship between source voltage V and pulse energy E.
Figure 2B:
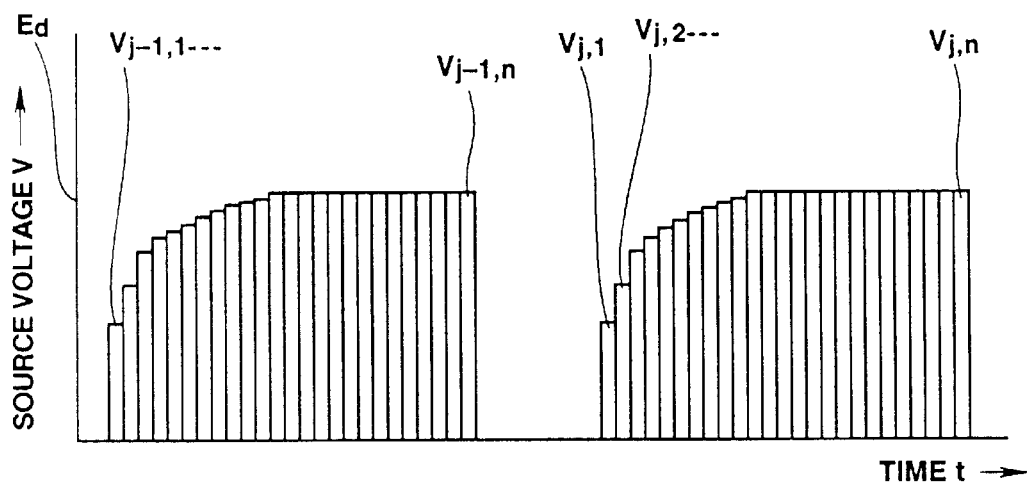

FIGS. 2(a) and 2(b) show the relationship between the source voltage V (2(b)) read from the table and the pulse energy E (2(a)) in the case of pulse oscillation according to this source voltage V. In this way, pulse oscillation is effected according to the V (j,i) read from the table and the real pulse energy is monitored; by revising the source voltage values stored in the table on this basis, variations in pulse energy E can be kept within the desired error range ΔE.

Moreover, Vj,i is revised as follows in the output control portion 26. In other words, in the case where the pulse energy of the laser beam changes from P to ΔP and when the source voltage is changed from V to V+ΔV during measurement of the laser beam characteristics, this ΔV and ΔP are measured, correlated and stored. Since this relationship can be expressed as the formula ΔV=f (p, ΔP), the degree to which the source voltage may then be revised can be calculated by fitting the increase or decrease of pulse energy in this formula.

Figure 3:
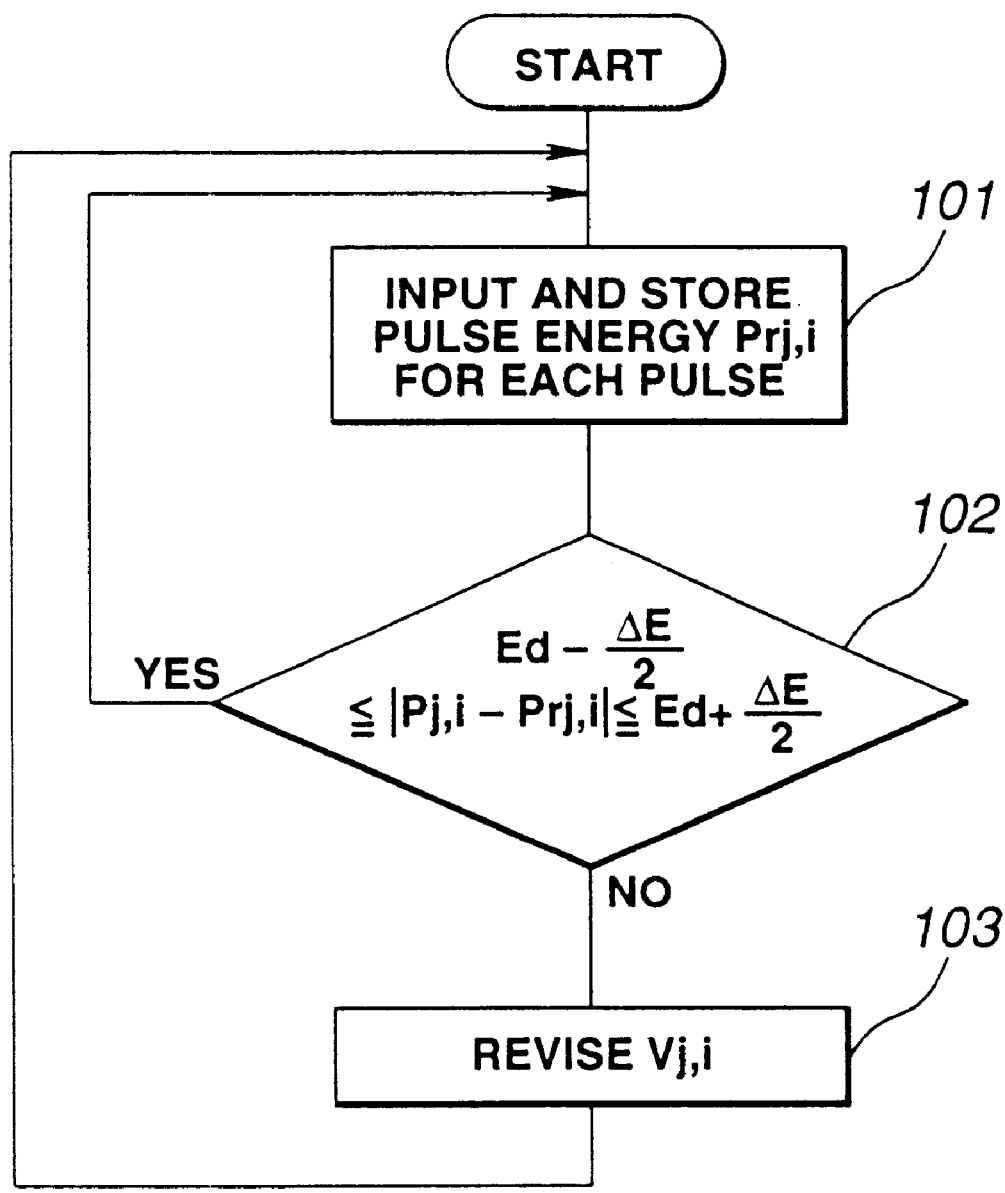
FIG. 3 is a flow chart to show the processing procedures of the output control portion and control portion in the case of revising pulse energy level.

Next, the processing procedures of the output control portion 26 and the control portion 27, in the case of effecting the revision of the pulse energy level during burst mode operation, is explained with the flow chart in FIG. 3.

The control portion 27 receives input of the actual pulse energy Prj,i for each single pulse from the output monitor 25 and stores in a memory which is not shown (Step 101). Then the control portion 27 reads the Pj,i corresponding to the Vj,i of one oscillated pulse from the table in the output control portion 26 and determines whether Ed−ΔE/2≦|Pj,i−Prj,i|≦Ed+ΔE/2 is established (Step 102). Here, when this formula is established, the level of pulse energy is within the error range and it is not necessary to revise the value of Vj,i; therefore returns to Step 101 and waits for the oscillation of the next pulse. On the other hand, when the formula is not established in Step 102, the level of the pulse energy exceeds the error range; therefore, the control portion 27 instructs the output control portion 26 to revise Vj,i (Step 103). In the output control portion 26, the value of Vj,i is revised according to the relational expression discussed above.

Next, the action of the output control portion 26 during burst mode operation is explained with exposure of a real wafer as an example.

First, the working procedure during burst mode operation is explained in a simple manner.

Figure 4:
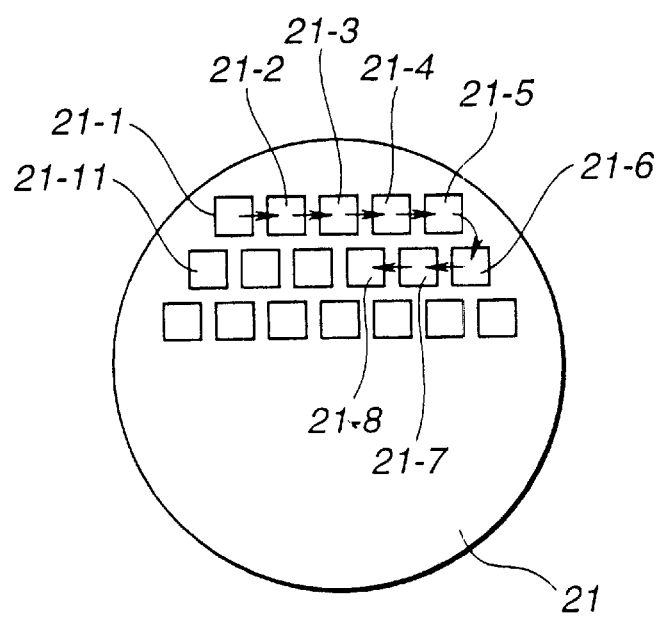
FIG. 4 is a diagram to show the arrangement of chips on a wafer.

FIG. 4 is a model to show the layout of chips on a wafer 21.

For the wafer shown in FIG. 4, the laser beam machining cycle is repeated as follows: exposure of the laser beam is effected in a sideways direction in the order of chips 21-1, 21-2, 21-3 and when 21-5 is finished, moves to the next row and effects exposure starting with chip 21-6 in the order of 21-7, 21-8, The wafer 21 is transported to the exposure position, not pictured, within the exposure apparatus body 29 in FIG. 1 and aligned at a position where exposure is possible. This time necessary for transportation and alignment corresponds to the stoppage time ΔT in FIG. 27. If alignment is complete, pulse oscillation of a laser beam for the chip 21-1 is started. This pulse oscillation corresponds to the No. 1 pulse group in FIG. 27. Then, when the pulse oscillation for the chip 21-1 is complete, the optical system is moved, etc. The time necessary for this corresponds to the stoppage time ΔT1 in FIG. 27.

Afterwards, the pulse oscillation of the laser beam for the next chip 21-2 is started. This pulse oscillation corresponds to the No. 2 pulse group in FIG. 27. Then, the same operation is repeated for chips 21-3 . . . 21-5.

When the laser beam oscillation for chip 21-5 is finished, the process moves to the next row. The time ΔT5 for the optical system to move from the chip 21-5 to the chip 21-6 is a longer time than ΔT1 through ΔT4 because of the distance and direction of the movement. Afterwards, the same operation as above is repeated for chips 21-6 to 21-11; when the pulse irradiation for chip 21-11 is complete, the process moves to the next row. This type of operation is effected for all rows of chips on the wafer. When exposure is complete, the wafer is transported from the exposure position and the next wafer is transported to the exposure position and aligned; then the same type of exposure operation is started.

Next, the relationship between the burst mode operation and the trigger signal Tr explained in FIG. 1 is explained.

As discussed above, the following various operations are effected with the exposure apparatus body 29: transport of the wafer, which is the machined object, alignment, movement and positioning of the optical system, wafer transport, and exposure confirmation. At the time when this series of operations is finished, an initial trigger signal Tr is output to the output control portion 26. The trigger signal Tr at this time becomes the trigger signal for the radiation of the first pulse in the No. 1 pulse group in FIG. 27. Then, the trigger signal Tr is repeatedly output from the exposure apparatus control portion 29 to the output control portion (26) until the completion of the exposure of the chip 21-1 shown in FIG. 4; and laser beam irradiation is effected for the input of each trigger signal. Consequently, the length of the laser oscillation stoppage time ΔTj between the No. j pulse group and the No. j+1 (i=1 to n-1) pulse group can be controlled by the interval at which the trigger signal Tr is received. In the same way, the length of th e laser oscillation stoppage time ΔT, necessary for wafer transport, alignment, movement and positioning of the optical system, and wafer transport, can also be controlled by the interval at which the trigger signal Tr is received. Because the laser oscillation stoppage time can be freely changed in this way, the laser oscillation stoppage time can correspond to machining where the laser oscillation stoppage time as shown in FIG. 4 varies while in progress.

Also the timer means, not pictured, with the output control portion 26 times the interval at which the trigger signal Tr is received. Therefore, it can be known whether the laser oscillation stoppage time corresponds to a time in FIG. 27, or whether the continuous pulse oscillation is in progress. In other words, the minimum value Ts and the maximum value Tu of ΔTj (j−1 to n) are determined in advance and compared with the interval time t at which the trigger signal Tr is received. The following determinations are made.

If t<Ts, then the continuous pulse oscillation is in progress
If Ts≦t<Tu, then t=ΔTj (j=1 to n)
If Tu≦t, then t=ΔT Moreover, all or part of these calculations are actually effected with the control portion 27, but they are explained below as if effected with the output control portion 26 in order to make the explanation easy to understand.

Figure 5:
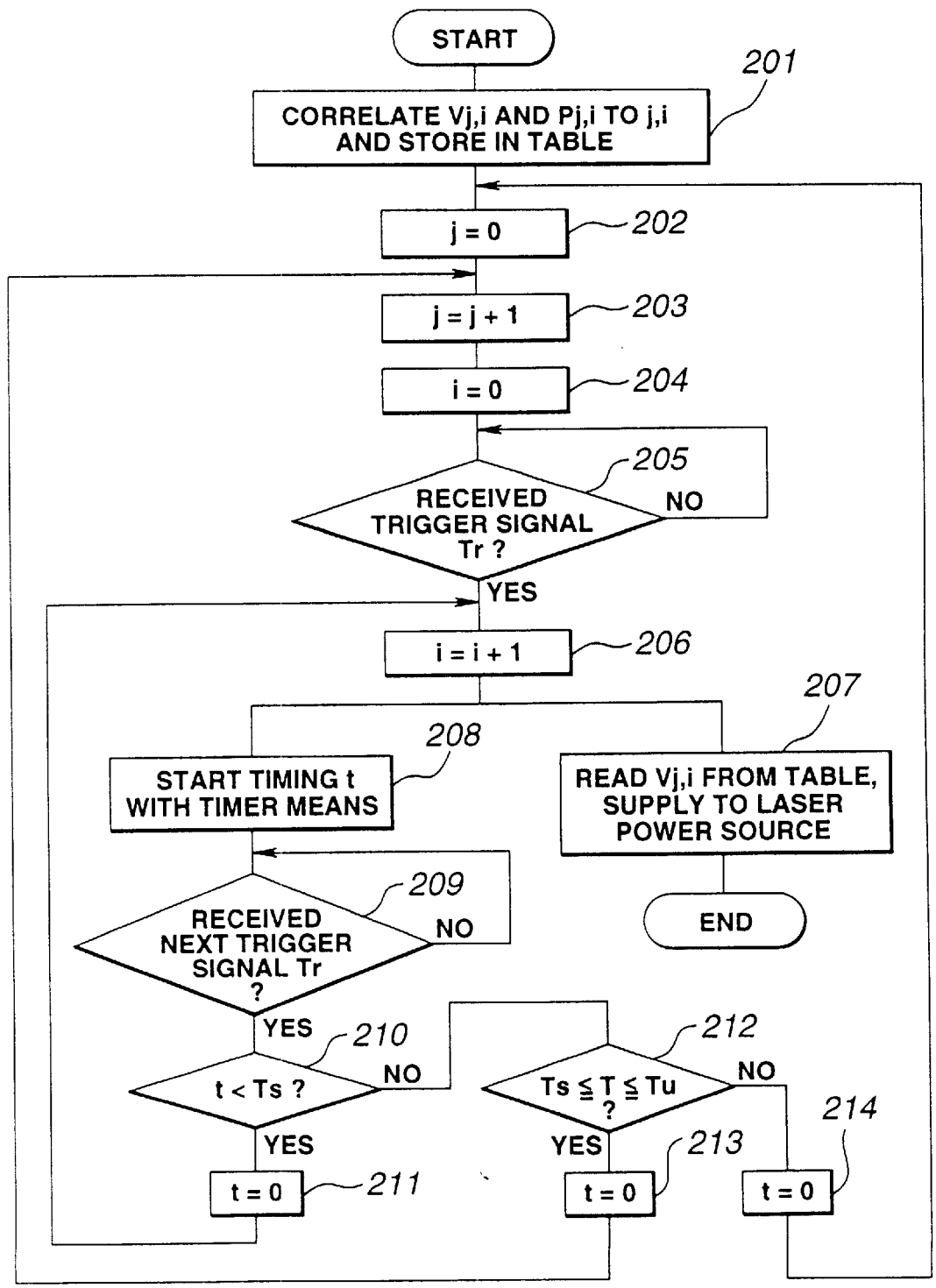
FIG. 5 is a flow chart to show the processing procedures of the output control portion in the case of burst mode operation based on the reception interval of the trigger signal Tr.

Next, the processing procedures of the output control portion 26, in the case of effecting burst mode operation based on the receiving interval of the trigger signal Tr, are explained with the flow chart in FIG. 5.

The output control portion 26 effects a test operation in burst mode, stores the source voltage Vj,i and pulse energy Pj,i at that time in the table in correlation to j and i (Step 201), then sets the count number j of the pulse group to 0 (Step 202).

Next, the count number j is increased by one increment (Step 203) and the count number i of the pulse is set to 0 (Step 204). Then, when the trigger signal Tr is received from the exposure apparatus control portion 29 (Step 205), the count number i of the pulse is increased by one increment (Step 206). Then the output controller 26 reads out Vj,i stored in the table for the parameters j and i and supplies this value to the laser power source 8 (Step 207). Moreover, the processing for revising the table in FIG. 3, discussed above, is effected concurrent to Step 207.

Also, the output control portion 26., concurrent to Step 207, starts the timing of the time t of the reception interval of the trigger signal Tr with the timer means therein (Step 208). Then, when the output control portion 26 receives the next trigger signal Tr from the exposure apparatus control portion 29 (Step 209), compares the timed reception interval time t with the minimum value Ts, and determines whether t<Ts (Step 210). Here, when t<Ts, in other words when the continuous pulse oscillation is in progress, the output control portion 26 sets t to 0 (Step 211) and returns to Step 206. By passing through the loop of Steps 206 to 211 in this way, each of the values Vj,i are read from the table for all pulses in a single pulse group and supplied to the laser power source 28.

Meanwhile, when t<Ts is not the case in Step 210, the reception interval time t, minimum value Ts, and maximum value Tu are compared and it is determined whether Ts≦t<Tu is formed (Step 212). When Ts≦t<Tu is formed, in other words when t is the laser oscillation stoppage time $\Delta Tj$ between two pulse groups, the output control portion 26 sets t to 0 (Step 213), returns to Step 203, and effects the process for the next pulse group.

When Ts≦t<Tu is not formed in Step 212, in other words when this is the long laser oscillation stoppage time $\Delta T$ for moving the optical system, etc., the output control portion 26 sets t to 0 (Step 214) and returns to Step 202. In this way, when the processing for a series of continuous pulse groups is complete, returns to Step 202, sets j to 0, and effects the processing for the next continuous pulse group.

Such control of the laser oscillation stoppage time is very effective in the following type of case. In other words, if the energy level of the laser beam is monitored on the exposure apparatus body 20 as well, it can be detected if the energy level of each pulse from the laser apparatus 1 varies from the desired value due to variations in the characteristics of the optical system between the laser apparatus 1 and the wafer, for example. In this case, variations in exposure level can be avoided by adjusting the light energy level of the final pulses in a continuous pulse group from the exposure apparatus body 20. Moreover, the light energy level of the pulses can be adjusted using a known variable optical attenuator. Because this control requires some time, the time to control the variable optical attenuator can be created by delaying the transmission interval of the trigger signal Tr.

Next, another embodiment, in the case of controlling burst mode operation with a trigger signal, is explained. In the case where a trigger signal to order one pulse oscillation, a trigger signal to order continuous pulse oscillation, and a trigger signal to order the completion of the laser beam machining cycle can be received from the exposure apparatus body 20 in a series of laser beam machining cycles, burst mode operation can be controlled based on these trigger signals. The processing procedure in the case of effecting burst mode operation based on such trigger signals for the laser beam machining cycle is explained with the flow chart in FIG. 6.

The output control portion 26 effects a test operation in burst mode, stores the source voltage Vj,i and pulse energy Pj,i at that time in the table in correlation to j and i (Step 301), then sets the count number j of the pulse group to 0 (Step 302).

Next, the count number j is increased by one increment (Step 303) and the count number i of the pulse is set to 0 (Step 304). Then, when the trigger signal Trks for starting the laser beam machining cycle is received from the exposure apparatus control portion 29 (Step 305), the count number i of the pulse is increased by one increment (Step 306). The output control portion 26 reads Vj,i stored in the table for the parameters j and i and supplies this value to the laser power source 28 (Step 307). Moreover, the processing for revising the table in FIG. 3, discussed above, is effected concurrent to Step 307.

Next, upon receiving the trigger signal from the exposure apparatus control portion 29, the output control portion 26 determines whether that trigger signal is the trigger signal Tr to order the next pulse oscillation (Step 308). Here, when the received signal is the trigger signal Tr, the process returns to Step 306. By passing through the loop of Steps 306 to 308 in this way, each of the values Vj,i are read from the table for all pulses in a single pulse group and supplied to the laser power source 28.

Also, when the trigger signal received in Step 308 is not the trigger signal Tr to order pulse oscillation, the output control portion 26 determines whether that trigger signal is the trigger signal TrB to order the next continuous pulse oscillation (Step 309). When that trigger signal is the trigger signal TrB to order continuous pulse oscillation, the process returns to Step 303. In this way, when the pulse oscillation in one pulse group is complete, the process returns to Step 303 and effects processing for the next pulse group.

Also, when the trigger signal received in Step 309 is not the trigger signal TrB to order continuous pulse oscillation, the output control portion 26 determines whether that trigger signal is the trigger signal TrkE for the completion of the laser beam machining cycle (Step 310). When that trigger signal is not the trigger signal TrkE for the completion of the laser beam machining cycle, the output control portion 26 returns to Step 308 and checks the trigger signal received while passing through the loop of Steps 308 to 310. Meanwhile, in Step 310, when that trigger signal is the trigger signal TrkE for the completion of the laser beam machining cycle, the process returns to Step 302. In this way, when the processing for a series of continuous pulse groups is complete, the output control portion 26 returns to Step 302, sets j to 0, and effects processing for the next continuous pulse group.

Figure 6:
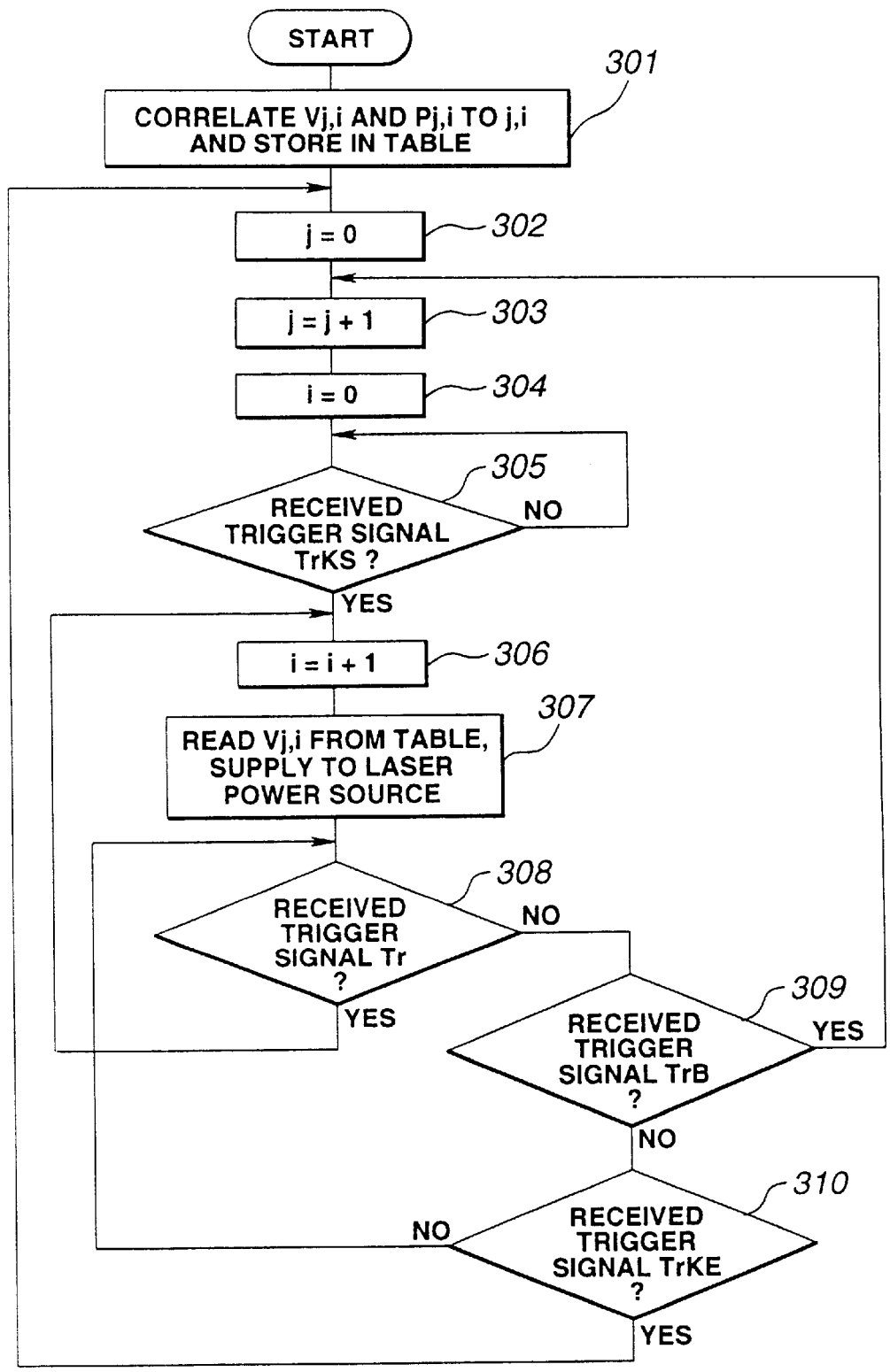
FIG. 6 is a flow chart to show the processing procedures in the case of burst mode operation based on the trigger signal for the light machining cycle.

With the embodiment in FIG. 6, the timing and number of all pulse oscillations in a laser beam machining cycle can be controlled arbitrarily according to each of the trigger signals for a laser beam machining cycle.

Up to this point, processing procedures for effecting burst mode operation based on the reception interval of the trigger signal Tr (FIG. 5) and the trigger signal for the laser beam machining cycle (FIG. 6) have been explained, but burst mode operation can also be controlled with the pulse number of a continuous pulse group.

Figure 7:
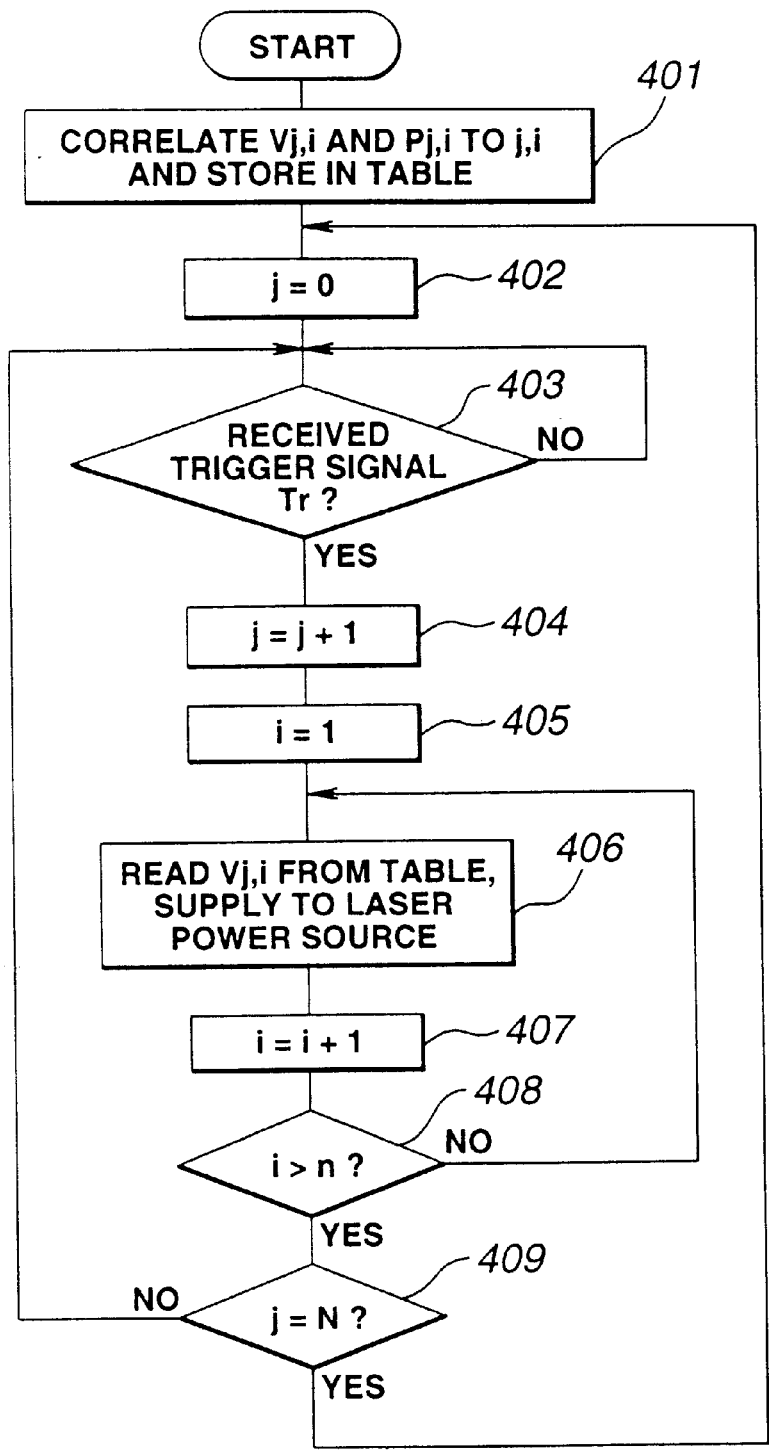
FIG. 7 is a flow chart to show the processing procedures in the case of burst mode operation based on the pulse number in a continuous pulse group.

Next, the processing procedures in the case of effecting burst mode operation based on the pulse number of a continuous pulse group is explained with the flow chart in FIG. 7.

The output control portion 26 effects a test operation in burst mode, stores the source voltage Vj,i and pulse energy Pj,i at that time in the table in correlation to j and i (Step 401), then sets the count number j of the pulse group to 0 (Step 402).

Next, upon receiving the trigger signal from the exposure apparatus control portion 29 (Step 403), the output control portion 26 increases the count number j by one increment (Step 404) and sets the count number i of the pulse to 0 (Step 405). Then, the output control portion 26 reads Vj,i stored in the table for the parameters j and i and supplies this value to the laser power source 28 (Step 406). Moreover, the processing for revising the table in FIG. 3, discussed above, is effected concurrent to Step 406.

Next the output control portion 26 increases the count number of the pulse i by one increment (Step 407), compares the count number i of the pulse to the pulse number n, and determines whether i>n (Step 408). When i>n is not the case, the process returns to Step 406. By passing through the loop of Steps 406 to 408, each of the values Vj,i are read from the table for all pulses (total number n) in a single pulse group and supplied to the laser power source 28.

Also, when i>n in Step 408, the output control portion 26 compares the count number j and total number N of pulse groups and determines whether j=N (Step 409). When j=N is not the case, the process returns to Step 403. In this way, when the processing for all pulse groups is not yet complete, the output control portion 26 returns to Step 402 and effects processing for the next pulse group upon receipt of the trigger signal Tr.

Also, when j=N in Step 409, in other words when processing for all pulse groups is complete, the output control portion 26 returns to Step 402, sets j to 0, and effects processing for the next succession of pulse groups.

In this embodiment, timing of the reception interval time of the trigger signal Tr by the timer means is not necessary, nor is the use of multiple trigger signals. In other words, the trigger signal Tr from the exposure apparatus control portion 29 is output only to order the initial pulse oscillation of a succession of pulse groups. The next trigger signal may only be received in the output control portion 26 after the predetermined number only of pulse oscillations is repeated.

With the foregoing embodiment, the source voltage Vj,i is read from the table upon the oscillation of one pulse and supplied to the laser power source 28. It may also be constituted so that a table for the first number of pulses in a succession of pulse groups is prepared and used to control pulse oscillation, and power lock control, discussed below, is effected for pulses oscillated after the first number of pulses.

Next, the method for preparing a table only for the first number of pulses and effecting control is explained as another embodiment.

The constitution of the apparatus in this embodiment is the same as in FIG. 1; the output control portion 26 has the following function.

In the output control portion 26, the pulse energy Pi input from the output monitor 25 is stored in a table as the pulse energy Pj,i of the number i in the pulse group No. j; the number of pulses Ns at which the spiking phenomenon is markedly exhibited is set in advance and data regarding pulse characteristics for each pulse group from the start to the number Ns is stored in the table. When the trigger signal Tr is received from the exposure apparatus control portion 29, the source voltage stored in this table is read for the pulses from the start to the number Ns; voltage data is provided to the laser power source 28 based on this. Power lock control (trademark of the Questek company of the US) is effected for the pulse oscillated following this number Ns pulse. Power lock control is a control to maintain the desired level of pulse energy Pi, for the phenomenon wherein the laser gas deteriorates and pulse energy Pi drops even through the same source voltage is provided, by increasing source voltage according to the deterioration of the gas. The source voltage for this purpose is called power lock voltage Vpl.

Also, in this embodiment, the pulse energy Prj,i of a real oscillated pulse is input to the control portion 27 from the output monitor 25. Each time pulse oscillation is effected, the control portion 27 compares the Pj,i stored in the table in the output control portion 26 to this Prj,i and orders a change to the source voltage value stored in the output control portion 26 as necessary.

Figure 8:
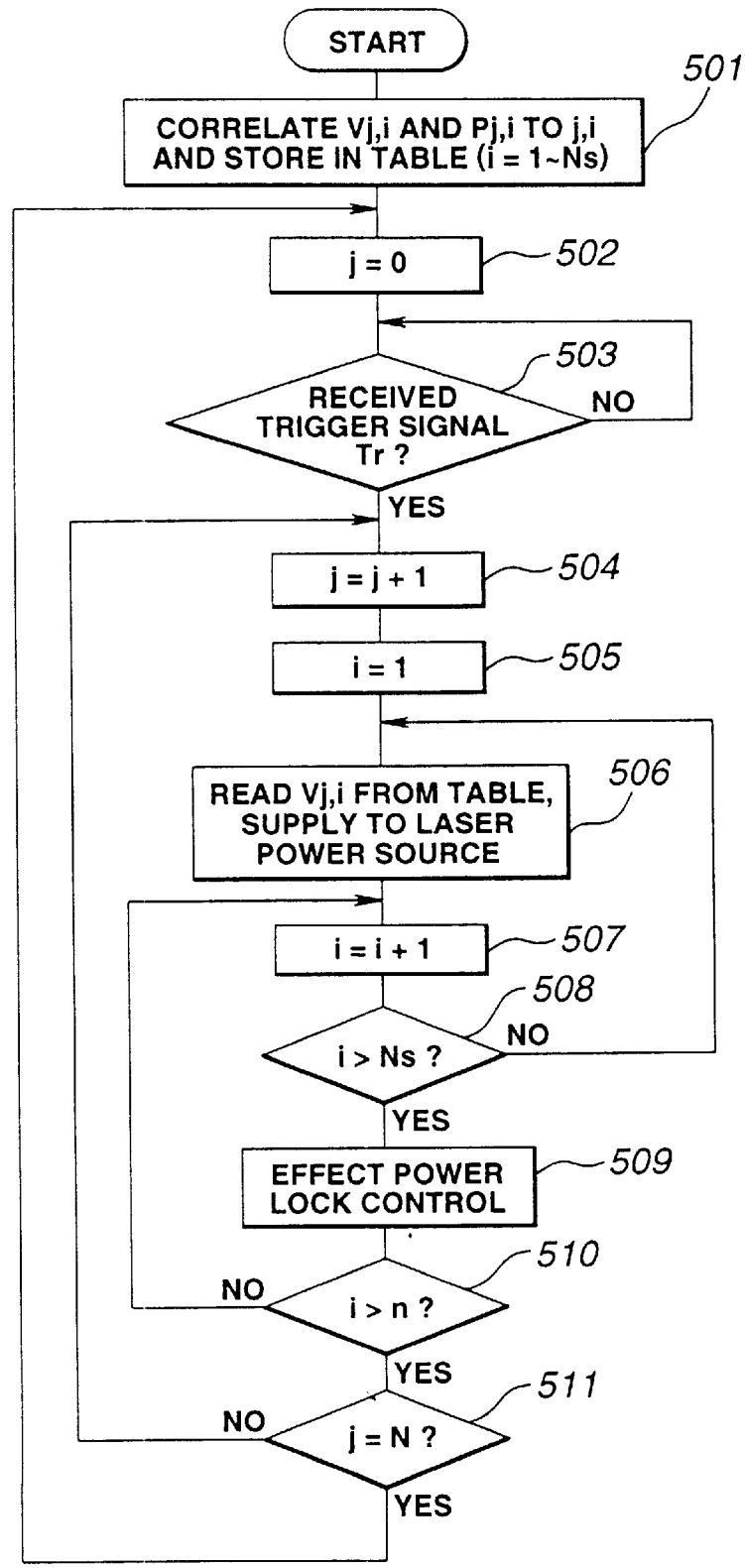
FIG. 8 is a flow chart to show the processing procedures in the case of burst mode operation based on the pulse number in a continuous pulse group and a table of only several pulses.

Next, the processing procedures in the case of effecting burst mode operation based on the table for only a few pulses discussed above and the pulse number of the succession of pulse groups is explained with the flow chart in FIG. 8.

The pulse number Ns at which the spiking phenomenon is markedly exhibited and a set value of source voltage are determined. Then, the output control portion 26 effects a test operation in burst mode, stores the source voltage Vj,i and pulse energy Pj,i at that time in the table in correlation to j and i (Step 501). However, i is in the range of 1 to ns. Next, the output control portion 26 sets the count number j of the pulse group to 0 (Step 502).

Next, upon receiving the trigger signal from the exposure apparatus control portion 29 (Step 503), the output control portion 26 increases the count number j by one increment (Step 504) and sets the count number i of the pulse to 0 (Step 505). Then, the output control portion 26 reads Vj,i stored in the table for the parameters j and i and supplies this value to the laser power source 28 (Step 506). Moreover, the processing for revising the table in FIG. 3, discussed above, is effected concurrent to Step 506.

Next the output control portion 26 increases the count number of the pulse i by one increment (Step 507), compares the count number i of the pulse to the pulse number Ns, and determines whether i>Ns (Step 508). When i>Ns is not the case, the process returns to Step 506. By passing through the loop of Steps 506 to 508, each of the values Vj,i are read from the table for the pulses from the start to Ns in a single pulse group and supplied to the laser power source 28.

Also, when i>Ns in Step 508, the control moves to power lock control (Step 509).

Next, the output control portion 26 compares the count number i of the pulse and pulse number n and determines whether i>n (Step 510). Here, when i>n is not the case, the process returns to Step 507. By passing through the loop of Steps 507 to 510, power lock control is effected for the remaining pulses (Ns+1 to n) following pulse number Ns.

Also, when i>n in Step 510, the output control portion 26 compares the count number j and the total number N of pulse groups and determines whether j=N (Step 511). Here, when j=N is not the case, the process returns to Step 504. In this way, when processing for all pulse groups is not yet compete, the output control portion 26 returns to Step 504 and effects processing for the next pulse group.

Also, when j=N in Step 511, the process returns to Step 502. In this way, when processing for all pulse groups is complete, the output control portion 26 returns to Step 502, sets j to 0, and effects processing for the next succession of pulse groups.

In this way, sufficient practical effects can be attained, even in the case where the source voltage is read from the table for the initial number of pulses and power lock control is effected for subsequent pulses. Also, in such control of laser oscillation stoppage time, it is not necessary to read the source voltage value from the table for every pulse oscillation; therefore, the processing load on the output control portion 26 can be reduced. Furthermore, it is possible to economize on memory capacity since it is not necessary to store data for every pulse in each pulse group.

Moreover, the flow chart in FIG. 8, discussed above, includes branches to determine pulse number Ns during the process of the flow chart in FIG. 7. However, the method of control using such a table of only a number of pulses is not limited to the example shown in FIG. 8 and can also be applied to the flow chart in FIG. 5 or 6, for example.

Figure 9:
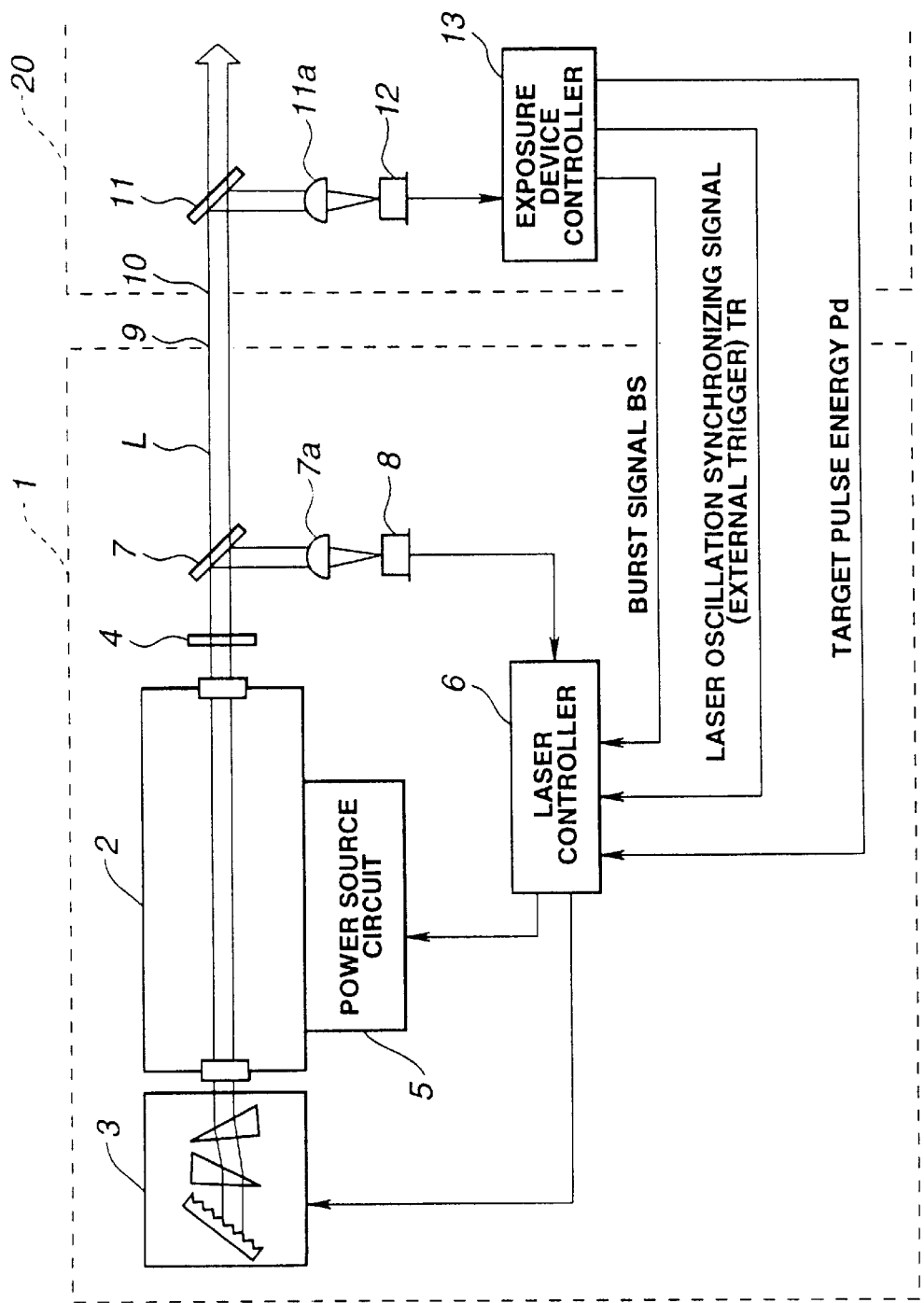
FIG. 9 is a block diagram to show the constitution of another embodiment of the present invention.

Next, FIG. 9 shows another constitution in the case where a laser apparatus relating to the present invention is applied as a light source in a stepper to effect reduction projection exposure processing of semiconductor circuit patterns. Specifically, in FIG. 9, 1 is a narrow-band excimer laser, being a laser apparatus, and 20 is a stepper, being the reduction projection exposure apparatus.

Figure 23:
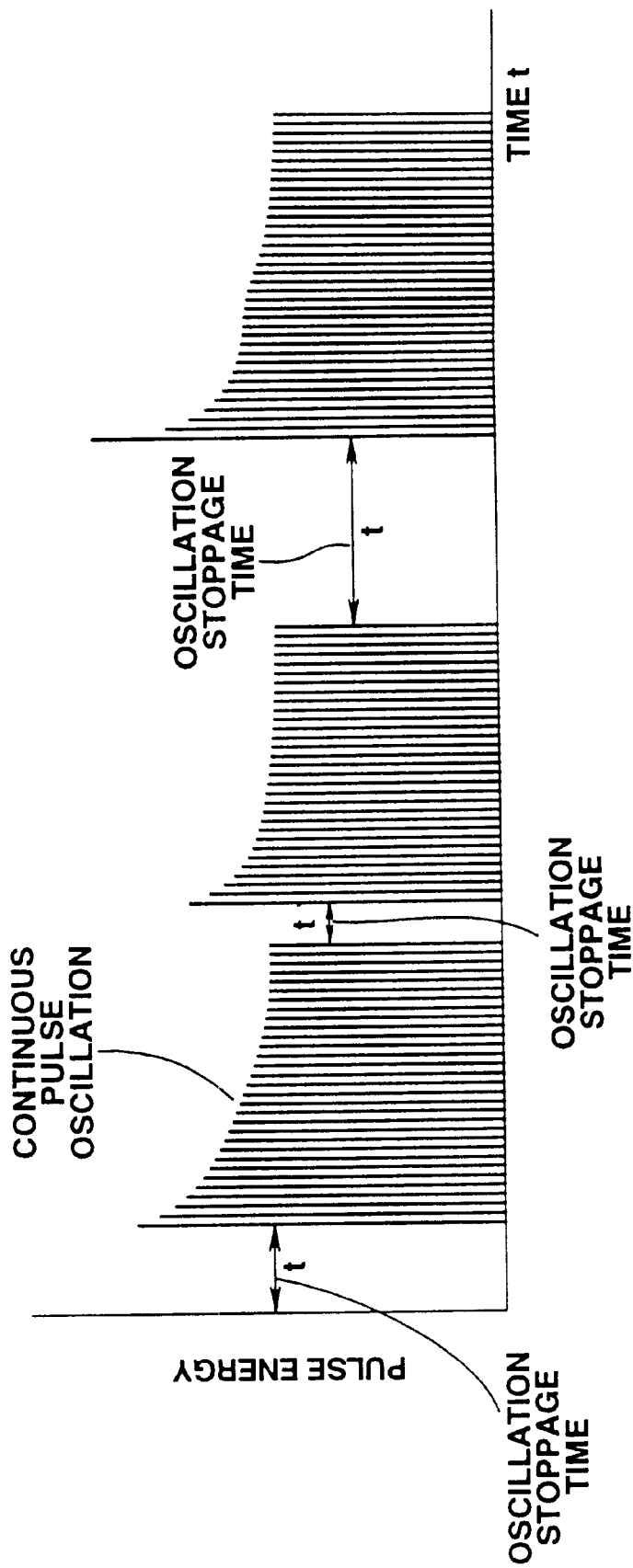
FIG. 23 is a diagram to show the pulse energy waveform in the burst operation in the case of constant charging voltage.

The laser chamber 2 of the excimer laser 1 comprises discharge electrodes, etc., not pictured; laser oscillation is effected by the excitation of the laser gas, comprising Kr, F2, Ne, etc., filling the laser chamber 2, by the discharge between the discharge electrodes. The beam emitted returns to the laser chamber 2 again, amplified, narrow-band with the narrow-banding unit 3, and output as an oscillated laser beam L via a front mirror 4. Then, part of the beam returns to the laser chamber 2 again and laser oscillation occurs. Moreover, the laser beam L, as shown in FIGS. 23 and 27 before, is output intermittently with the burst mode operation which repeatedly alternates between a continuous oscillation operation, of pulse oscillation continuously at a prescribed frequency for a prescribed period, and a stoppage operation, to stop the continuous pulse oscillation for a prescribed period following the continuous oscillation operation.

The laser power source circuit 5 provides potential difference V between the discharge electrodes, according to the voltage data provided from the laser controller 6, and effects discharge. Moreover, in the laser power source circuit 5, discharge is effected with the action of a switch element, such as a thyratron, for example, after being charged up with the charging circuit, not pictured.

Oscillated from a resonator constituted of a front mirror (4), a laser chamber 2, and a narrow-band unit 3, the laser beam L is partially sampled with a beam splitter 7 and input to a beam monitor module 8 via a lens 7a. Also, the remainder of the laser beam L is output to the exposure apparatus 20 via a slit 9.

Each time pulse oscillation is effected, the energy Pi (i=1, 2, 3, . . . ) per each pulse of the output laser beam L is detected with the beam monitor module 8. This detected pulse energy value Pi is stored in the table as the pulse energy Pj,i of the number i in the No. j pulse group. Moreover, the spectral line width and wavelength, etc., of the laser beam L are detected with the beam output monitor 8, and these data are also input to the laser controller 6.

Figure 10:
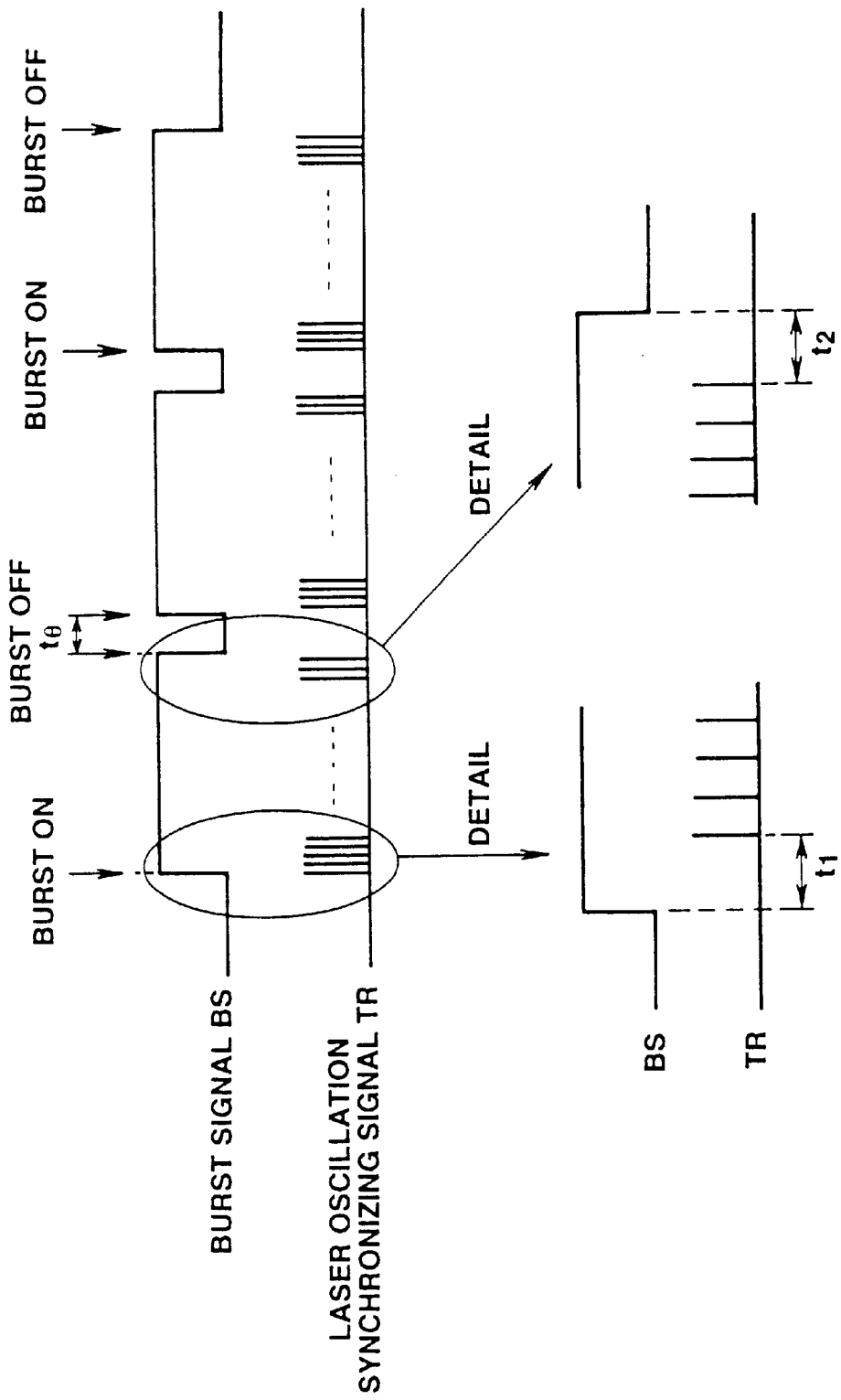
FIG. 10 is a time chart of the burst signal and laser oscillation synchronization signal.

The following signals are input to the laser controller 6 from the exposure apparatus 20:

Burst signal BS (See FIG. 10)

Laser oscillation synchronizing signal (external trigger) TR (See FIG. 10)

Target pulse energy value Pd

The laser oscillation synchronizing signal TR functions as a trigger signal for each pulse during continuous pulse oscillation with the laser apparatus 1. The burst signal BS functions in such a manner that its onset starts continuous oscillation operation with the laser apparatus 1 (burst on), and its end stops continuous oscillation operation with the laser apparatus 1 (burst off). The burst signal BS is set so that the first laser oscillation synchronizing signal TR is emitted after a prescribed time t1 from burst on, and burst off is effected after a prescribed time t2 following the emission of the final laser oscillation synchronizing signal TR.

Based on these input signals, the laser controller 6 effects spike control in the spike zone, which includes a prescribed number of initial pulses at the time of continuous pulse oscillation, and effects in-burst pulse energy control in the subsequent plateau and stable zones. The details are explained below.

A beam splitter 11, to sample part of the laser beam L input via a slit 10, is installed in the exposure apparatus 20.

The sampled light is sent to the beam monitor module 12 via a lens 11a. The energy Pi per one pulse of the input laser beam L is detected in the beam monitor module 12. This detected energy Pi is input to the exposure apparatus controller (13). Moreover, the laser beam which passed through the beam splitter 11 is used in reduction exposure processing.

In addition to the control of the movement of the stage on which the wafer is mounted and the reduction exposure processing, the exposure apparatus controller 13 executes the action of transmitting the laser oscillation synchronizing signal TR, burst signal BS, and target pulse energy value Pd to the laser apparatus 1.

Figure 11:
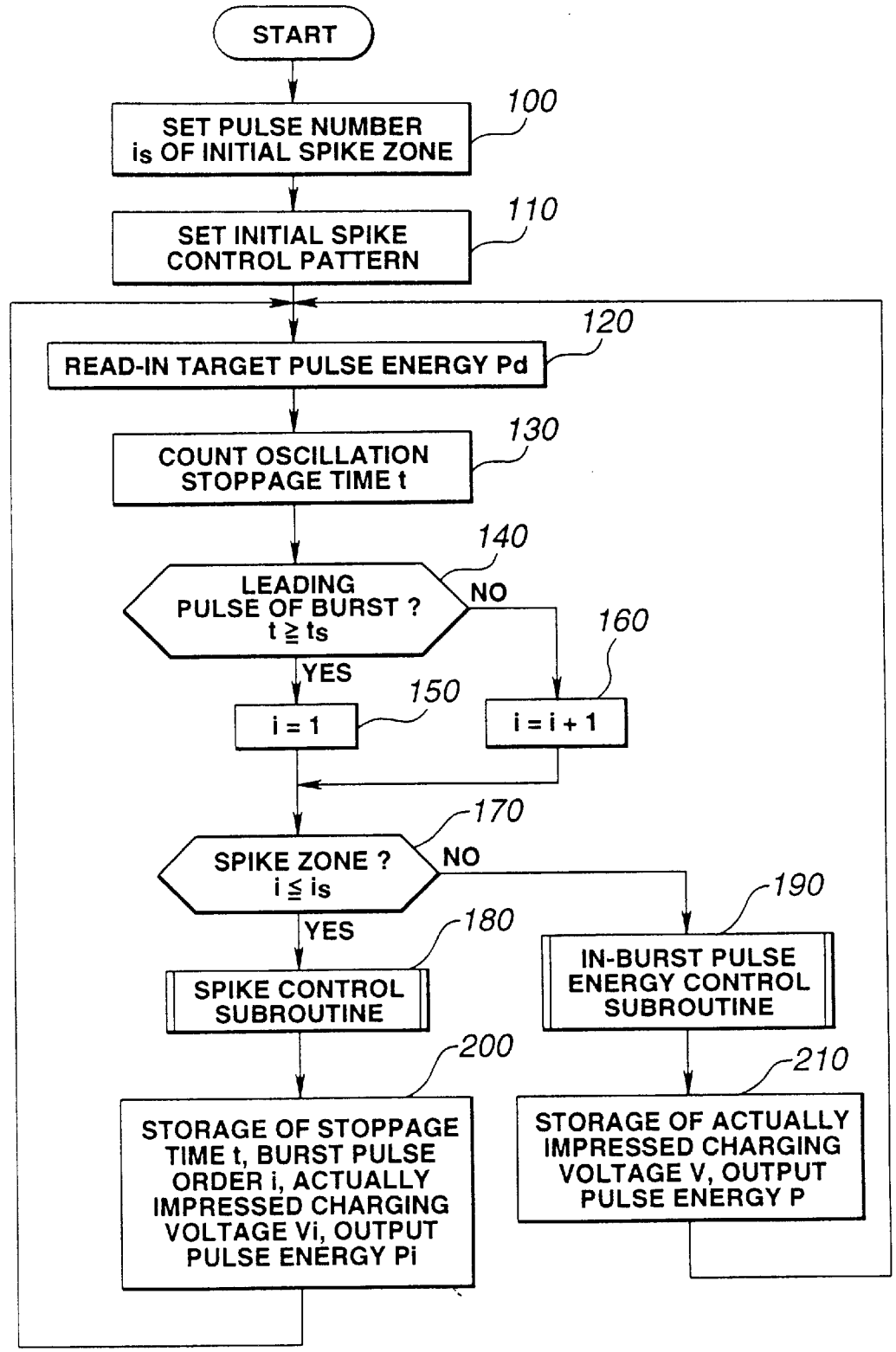
FIG. 11 is a flow chart to show the control procedures of the embodiment in FIG. 9.

Next, the action of the laser controller 6 during burst mode operation according to the flow chart in FIG. 11 is explained.

Figure 24:
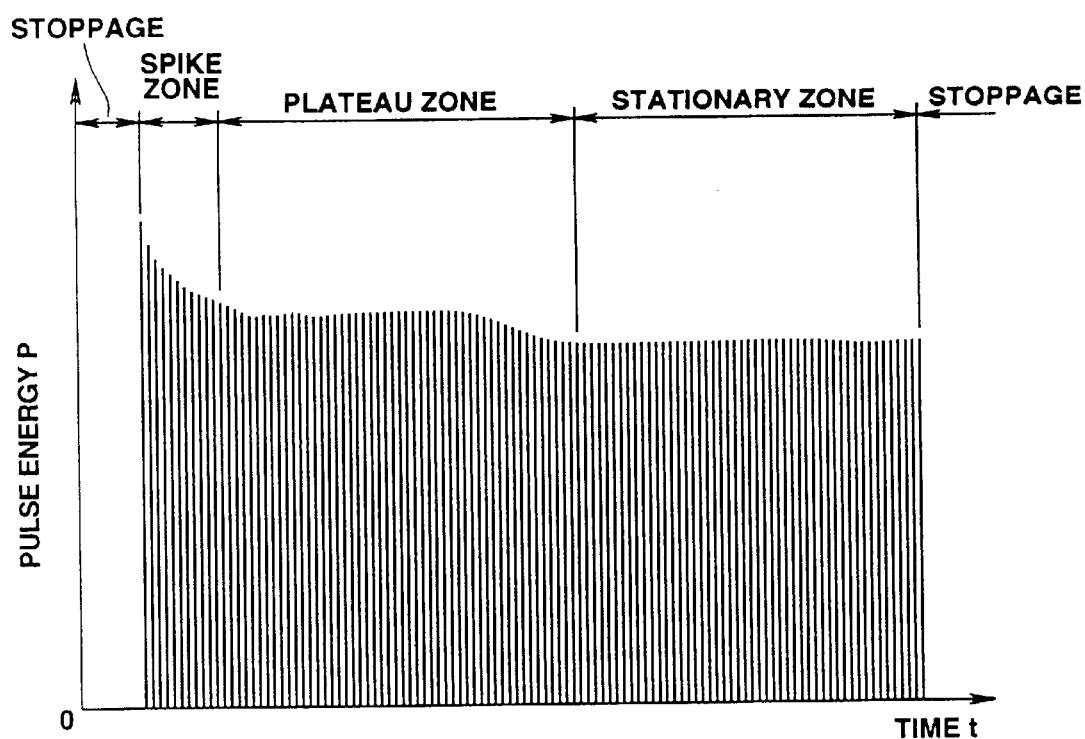
FIG. 24 is a detail of the pulse energy waveform in FIG. 23 to show the pulse energy wave form of one continuous pulse oscillation.
Figure 25:
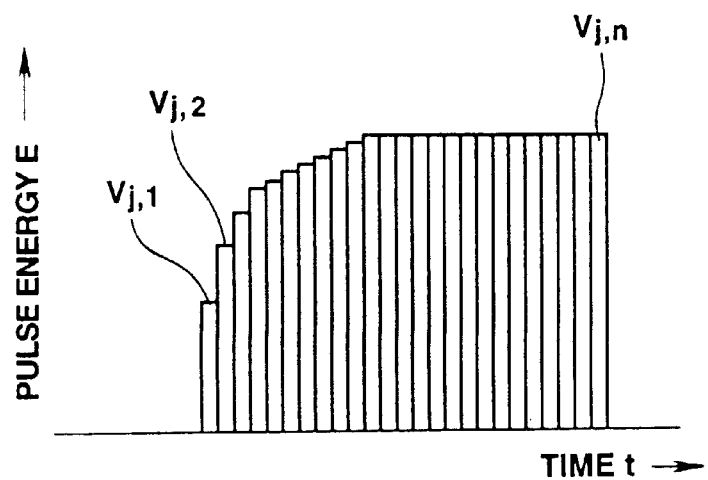
FIG. 25 is a diagram to show the excitation intensity pattern.
Figure 26:
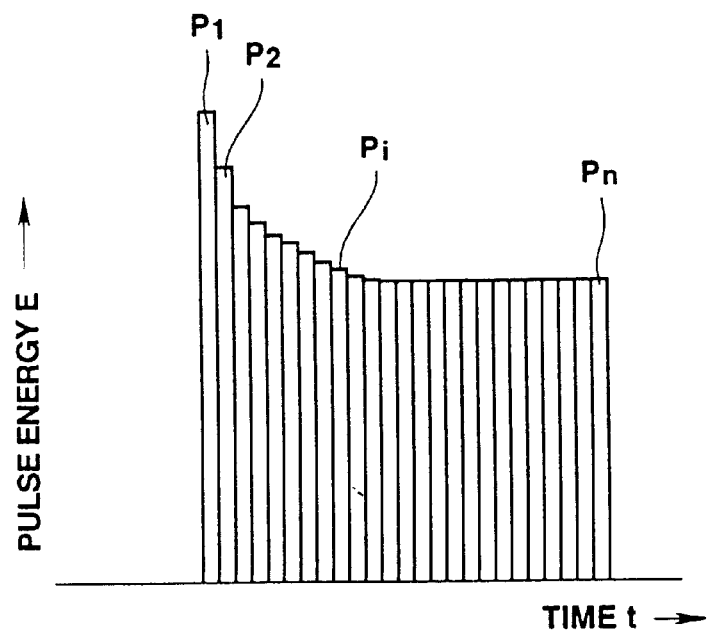
FIG. 26 is an explanatory diagram to show an specific example of the spiking phenomenon.

The laser controller 6 sets the pulse number is of the initial spike zone where spike control should be effected (Step 100). In other words, the pulse number included in the spike zone of FIG. 24 is set as is, since the properties of the pulse energy in continuous pulse oscillation show properties as shown in FIG. 24, for example.

Next, the laser controller 6 sets the (excitation intensity pattern) charging voltage pattern (initial spike control patter) to be provided during the initial number is of set pulse oscillations at the time of the first continuous pulse oscillation (Step 100).

Next, the laser controller 6 reads in the target pulse energy Pd provided from the exposure apparatus controller 13 (Step 120) and then initiates the timing of the oscillation stoppage time (reception interval of trigger signal TR) t (Step 130).

Next, when the external trigger signal TR is input from the exposure apparatus controller 13, the laser controller 6 determines whether this input external trigger TR is the first external trigger (Step 140). In other words, since the timer means within, not pictured, times the reception interval Ttr of the trigger signal TR, a comparison of this elapsed time Ttr to the prescribed set value ts in the laser controller 6 can determine whether the current point in time is during the continuous oscillation or the stoppage time between the continuous oscillation and the next continuous oscillation.

Specifically, this is the determination: If Ttr<ts, during continuous pulse oscillation If ts≦Ttr, stoppage time between the continuous oscillation and the next continuous oscillation.

Moreover, in this case, since the burst signal BS is input from the exposure apparatus controller 13, the start of the continuous oscillation may be determined by detecting if the burst signal BS is ON.

The laser controller 6 determines that the trigger signal TR input this time is the first pulse and after setting i=1 (Step 150), determines whether the current time is the spike zone by comparing this i to the pulse number is of the initial spike zone set previously. In the case where it is the spike zone, the laser controller 6 executes the spike control subroutine in Step 180.

Figure 12:
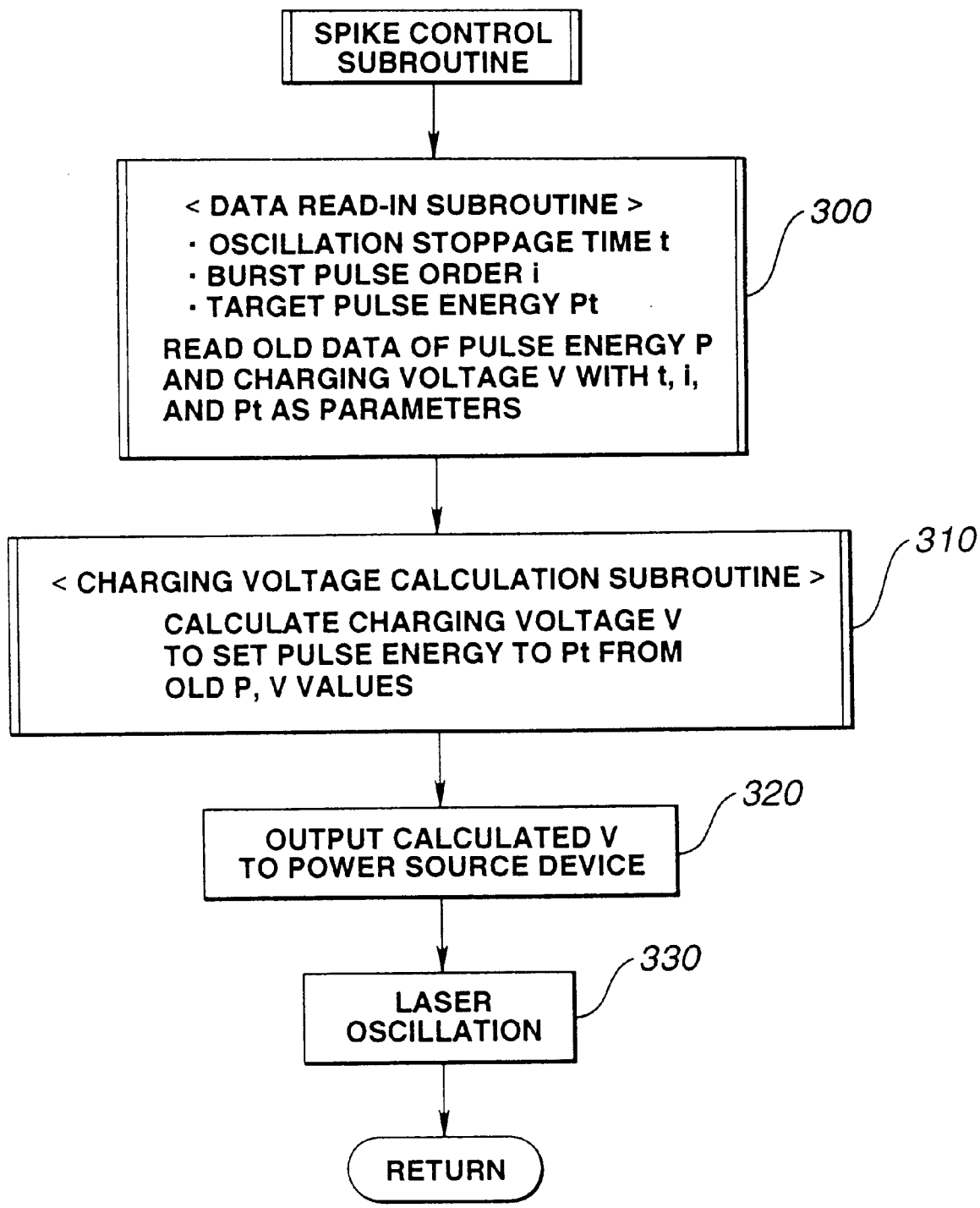
FIG. 12 is a flow chart to show the spike control subroutine in FIG. 11.

FIG. 12 shows the control procedures of the spike control subroutine and effects the data read-in subroutine (Step 300). In this data read-in subroutine 300, the oscillation stoppage time t, burst pulse number i, target pulse energy Pt are read in and old data relating to the charging voltage (excitation intensity) V and the pulse energy P (of the previous burst period) are read with this t, i, and Pt as parameters.

Figures 13A, 13B:
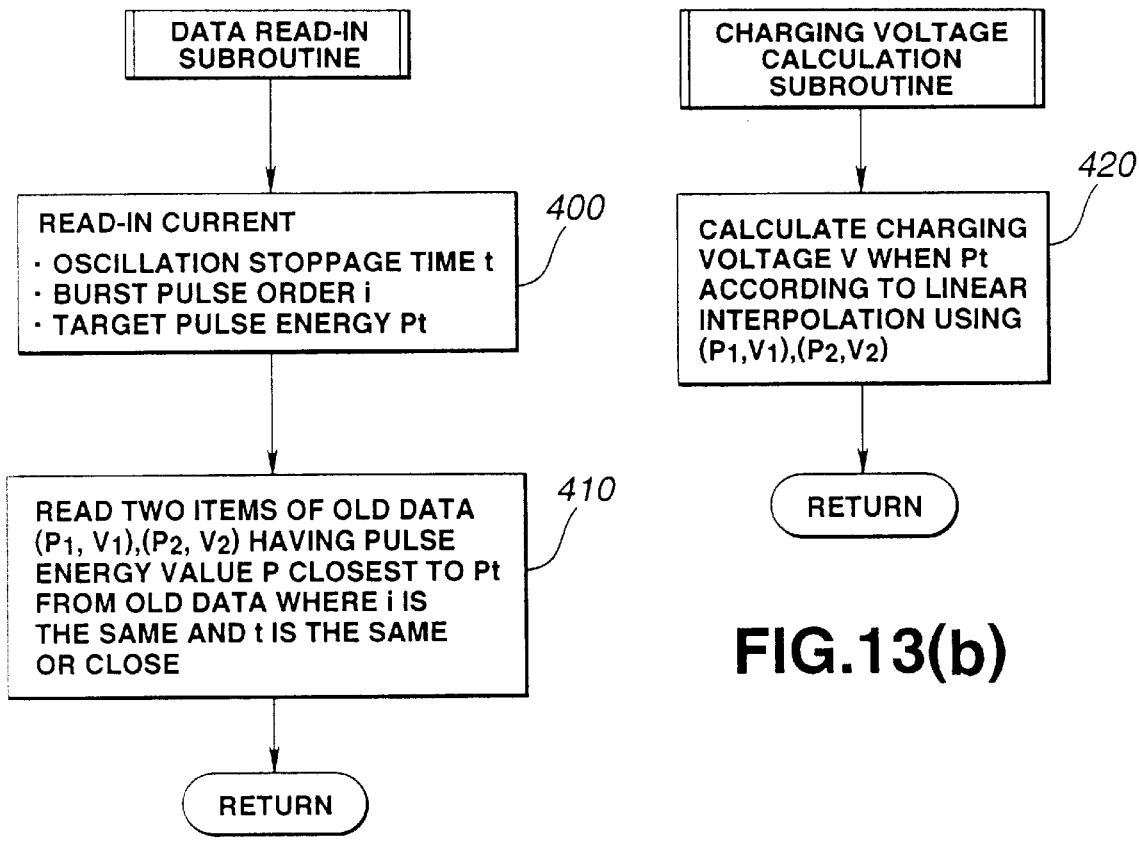
FIGS. 13(a) and 13(b) are diagrams to show the data read-in subroutine and charging voltage calculation subroutine in the spike control subroutine in FIG. 12.

Actually, as shown in FIG. 13 (a) for example, the oscillation stoppage time t, burst pulse number i, and target pulse energy Pt are read-in (Step 400); data, wherein the burst pulse number i is the same, and the oscillation stoppage time t is the same or closest, is extracted from old data; and from this extracted data, two items of charging voltage data and pulse energy data (P1, V1) and (P2, V2) having the pulse energy P closest to the target energy Pt are read (Step 410).

Next, the laser controller 6 executes the charging voltage calculation subroutine (Step 310) in FIG. 12. In this charging voltage calculation subroutine, the charging voltage value V to set pulse energy to the target value Pt is calculated using the two items of the old data of charging voltage data and pulse energy data (P1, V1) and (P2, V2) which were read.

Actually, for example, the charging voltage V to realize the target value Pt is calculated using the linear interpolation operation shown in the following formula and using the two items of old data (P1, V1) and (P2, V2), as shown in FIG. 13 (b) (Step 420).

$$(P2-P1)/(V2-V1)=(Pt-P1)/(V-V1)$$

$$V=V1+(V2-V1)(Pt-P1)/(P2-P1)$$

Next, in FIG. 12, the laser controller 6 outputs the calculated excitation intensity value (charging voltage value) V to the power source apparatus 5 (Step 320) and executes the laser oscillation according to this excitation intensity value (charging voltage value) V (Step 330).

When this type of spike control subroutine is compete, the laser controller 6 takes the current pulse energy value Pi from the beam monitor module 8 and stores this pulse energy value Pi, along with the current oscillation stoppage time t, burst pulse number i, and the charging voltage value V actually applied, in the prescribed memory table (FIG. 11 Step 200). As below, the procedures in Steps 120 to 200 are repeated until i=is, specifically until the spike zone is finished.

Figure 14A:
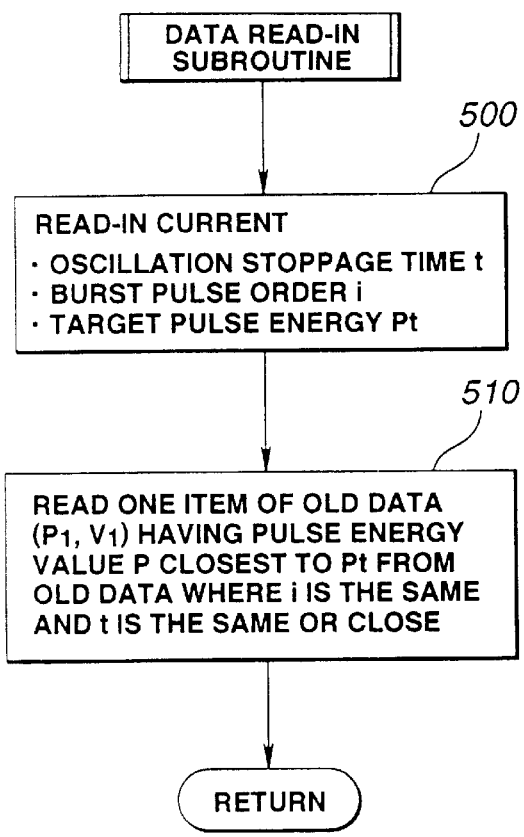
FIGS. 14(a) and 14(b) are diagrams to show another example of the data read-in subroutine and charging voltage calculation subroutine in the spike control subroutine in FIG. 12.
Figure 14B:
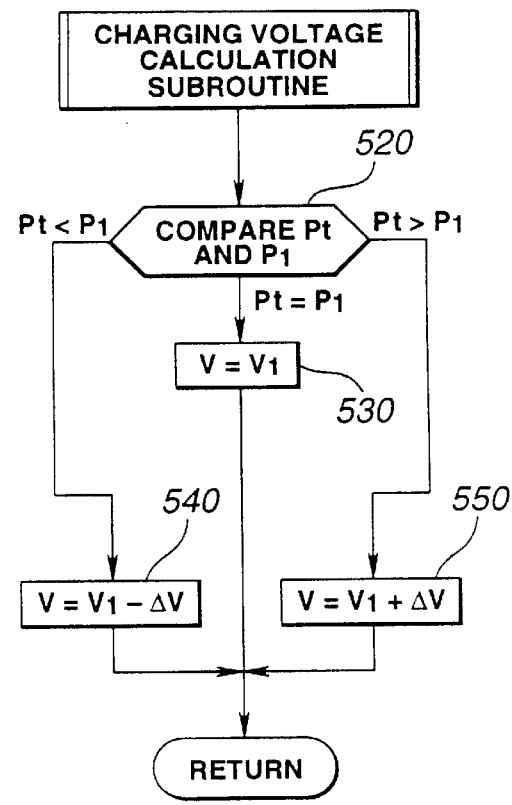

Next, FIG. 14 (a) shows another example of the data read-in subroutine shown in FIG. 12. Also, FIG. 14 (b) shows another example of the charging voltage calculation subroutine shown in FIG. 12.

In FIG. 14 (a), the oscillation stoppage time t, burst pulse number i, and target pulse energy Pt are read-in (Step 500); data, wherein the burst pulse number i is the same, and the oscillation stoppage time t is the same or closest, is extracted from old data; and from this extracted data, one item of charging voltage data and pulse energy data (P1, V1) having the pulse energy P closest to the target energy Pt is read (Step 510).

Also, in the case where such a data read-in subroutine is executed, the one item of old data (P1, V1), which was read, is compared to the target energy value Pt (Step 520) in the charging voltage calculation subroutine as shown in FIG. 14 (b). In the case where P1=Pt, charging voltage value V=V1 (Step 530). In the case where Pt>P1, V=V1+ΔV (ΔV: prescribed setting). In the case where Pt<P1, V=V1-ΔV.

When spike control is completed in this way, the laser controller (6) determines the excitation intensity (charging voltage) necessary in order to set the next pulse energy value to the desired value, from the relationship of the excitation intensity (charging voltage) of the pulse oscillation preceding each pulse and the pulse energy value thereof, in the plateau zone and stable zone where i>is as shown in FIG. 11 and executes the in-burst pulse energy control subroutine to effect pulse oscillation according to the excitation intensity which was determined (Step 190).

Figure 15:
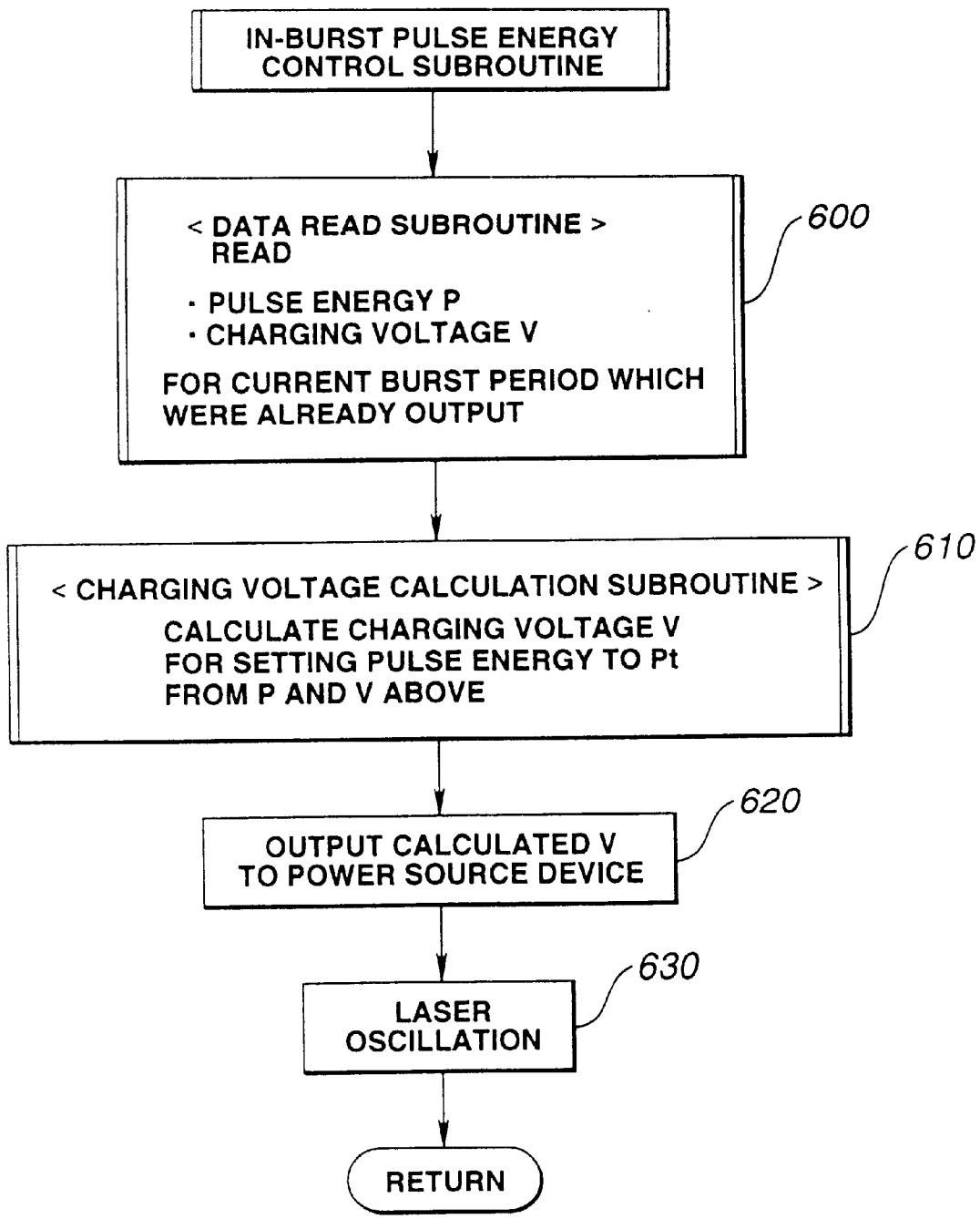
FIG. 15 is a flow chart to show the control subroutine for burst pulse energy in FIG. 11.

In this in-burst pulse energy control subroutine, the data read subroutine is executed as shown in FIG. 15 (Step 600). In other words, the data read subroutine is the action for reading the pulse energy value Pi of a pulse already output in the current burst period and the excitation intensity (charging voltage) V at that time.

Figure 16A:
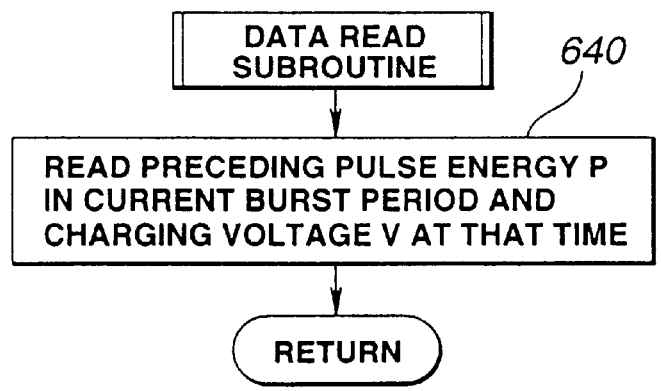
FIGS. 16(a), 16(b) and 16(c) are flow charts to show the data read subroutine in the control subroutine for burst pulse energy in FIG. 15.
Figure 16B:
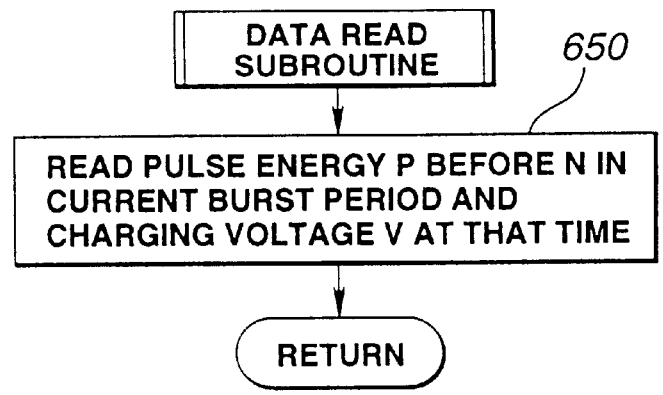
Figure 16C:
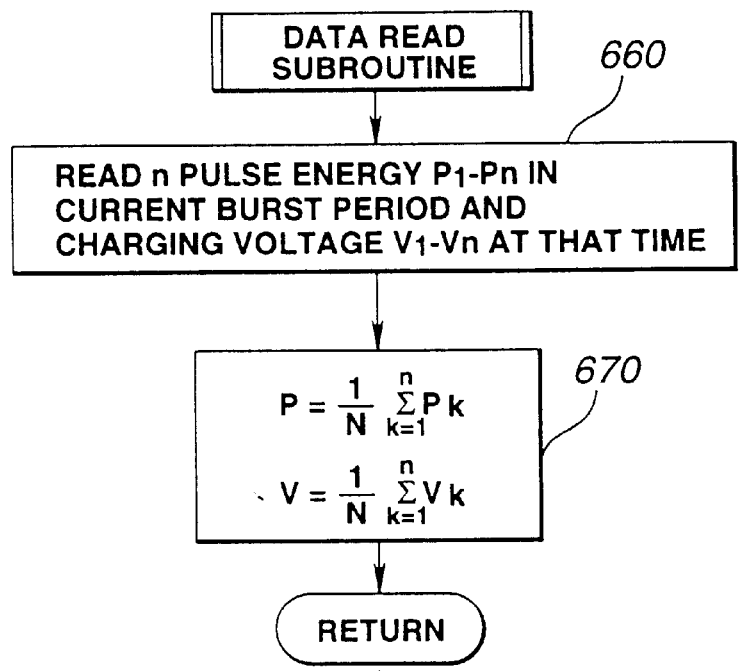

An actual example is shown in FIG. 16 (a) to (c). In FIG. 16 (a), the pulse energy value Pi of the preceding pulse in the current burst period and the charging voltage V at that time are read (Step 640).

In FIG. 16 (b), the pulse energy value Pi of the pulse preceding the N (for example N=2, N=3, etc.) pulse in the current burst period and the charging voltage V at that time are read (Step 650).

In FIG. 16 (c), the pulse energy P1 to Pn of n pulses in the current burst period and the corresponding charging voltage V1 to Vn are read and their average values are set to the pulse energy value P and charging voltage V for reference (Steps 660, 670).

Moreover, the n pulse which came off the pulse preceding the pertinent pulse may be used as the n pulse shown in FIG. 16 (c).

When this data read subroutine is complete, the laser controller (6) executes the charging voltage calculation subroutine (Step 610) as shown in FIG. 15.

Figure 17:
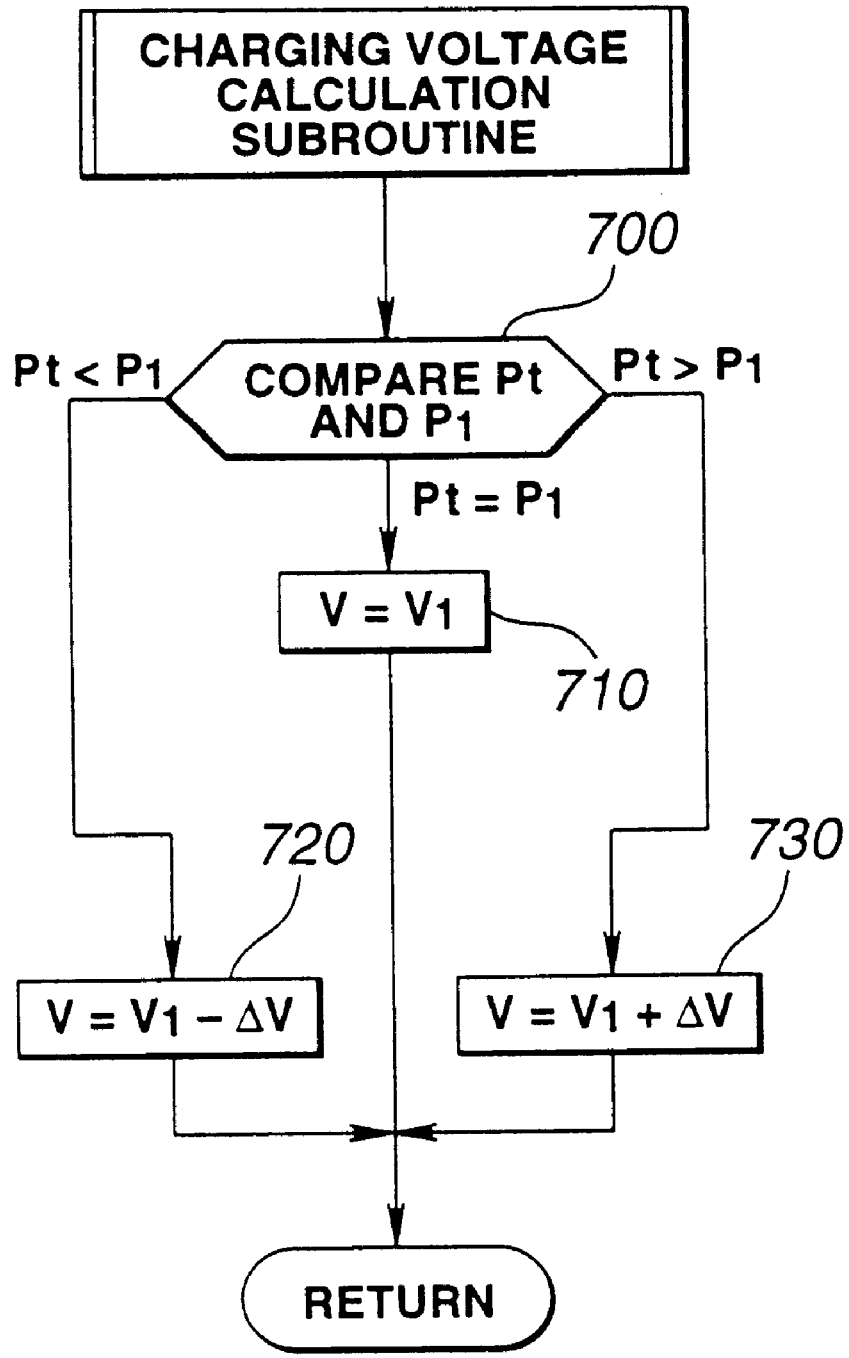
FIG. 17 is a flow chart to show the charging voltage calculation subroutine in the control subroutine for burst pulse energy in FIG. 15.

This charging voltage calculation subroutine is for the purpose of calculating the charging voltage value V to set the pulse energy to the target value Pt using the charging voltage V and the pulse energy P which were read; FIG. 17 shows an actual example.

In other words, the pulse energy value P1 of the read data (P1, V1) is compared to the target energy value Pt (Step 700) in FIG. 17. In the case where P1=Pt, charging voltage value V=V1 (Step 710); in the case where Pt>P1, V=V1+ΔV (ΔV: prescribed setting); and in the case where Pt<P1, V=V1-ΔV.

When this in-burst pulse energy control subroutine is complete, the laser controller (6) stores the charging voltage V1 impressed at this time and its laser output monitor value Pi in the prescribed memory table (FIG. 1 Step 210). The laser controller (6) repeats such processing until the continuous pulse oscillation of the current burst period is complete.

Figure 18A:
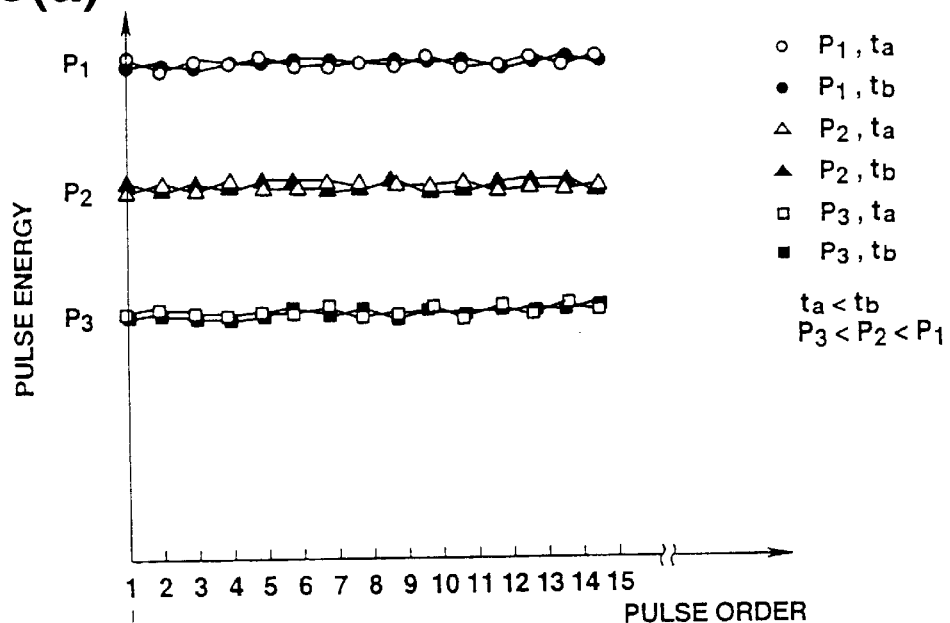
FIGS. 18(a) and 18(b) are diagrams to show experimental results relating to the charging voltage and pulse energy, in the case where target pulse energy is changed to three different values and oscillation stoppage time is changed to two different values in the initial period of burst oscillation.
Figure 18B:
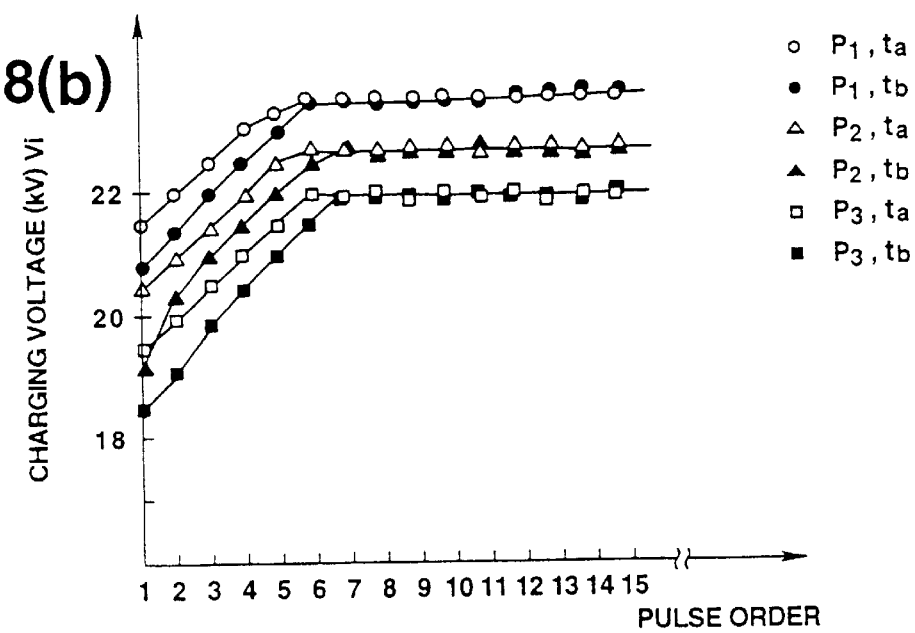

In FIG. 18 shows the results of an experiment under a total of six different conditions, in the case where the target pulse energy Pd was changed into three different values P1, P2, and P3 (P1<P2<P3) and the oscillation stoppage time t was changed into two different values ta, tb (ta<tb), in the initial part of burst oscillation. In FIG. 18 (a), the monitor value of each pulse energy is shown for each oscillation order i. Each charging voltage value Vi for each oscillation order i is shown in FIG. 18 (b).

In this case it is clear that the spiking phenomenon is recovered and each pulse energy agrees with the target value (P1, P2, P3) as shown in FIG. 18 (a) if the charging voltage shown in FIG. 18 (b) is provided. As understood from FIG. 18 (b), the charging voltage value Vi is greatly increased at this time in order to eliminate the spiking phenomenon by the seventh pulse, but the charging voltage value becomes constant after the seventh pulse. Also, since the spiking phenomenon becomes marked when the oscillation stoppage time t becomes long, it is understood that the charging voltage corresponding to the initial pulse of the continuous pulse must be lower when the oscillation stoppage time t becomes long. Furthermore, it is understood that the charging voltage must be increased the greater the target pulse energy Pd becomes.

Consequently, in the embodiment shown in FIG. 11, control of the excitation intensity (charging voltage control) with the target pulse energy Pd, oscillation stoppage time t, and oscillation order i as parameters, is performed only in the spike zone corresponding to the initial pulses; in the subsequent plateau zone and stable zone, control of the excitation intensity (charging voltage control) is performed with reference to the energy value of the pulses already oscillated within the current burst period. In other words, spike killer control is performed in the initial pulses in the continuous pulse oscillation since the laser oscillation stoppage still has a strong influence. In subsequent pulses, however, source voltage control according to the circumstances of the preceding pulse oscillation (output power corresponding to impressed source voltage) is performed because the preceding pulse oscillation has greater influence than the laser oscillation stoppage.

Figure 19A:
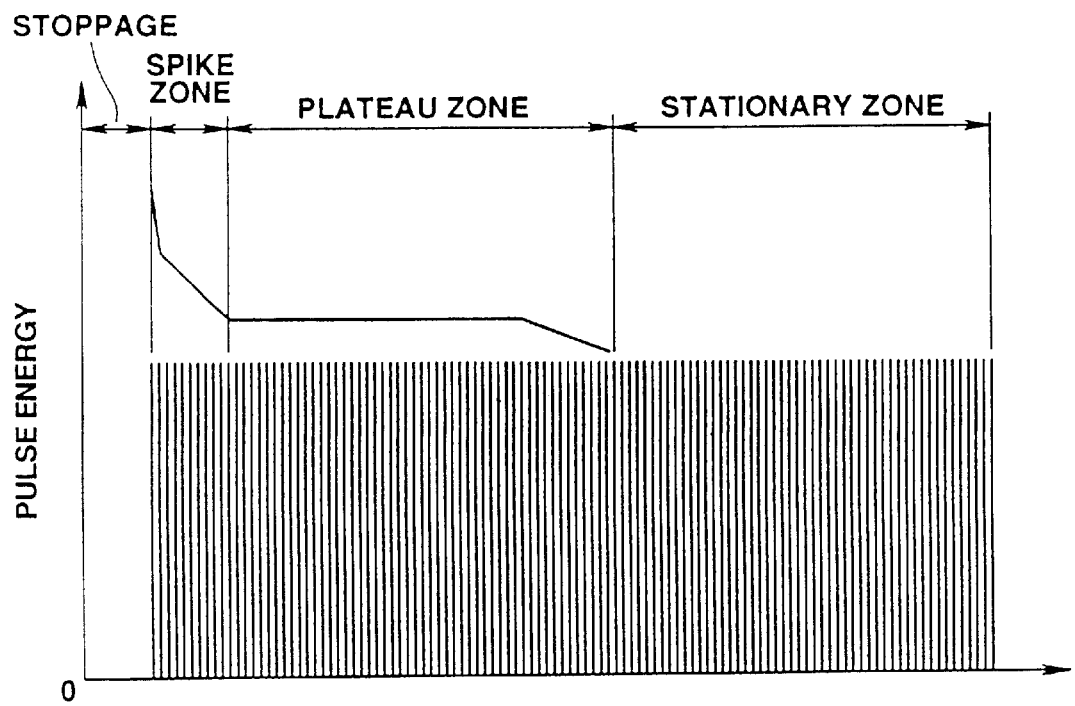
FIGS. 19(a) and 19(b) are diagrams to show experimental results of charging voltage control with the embodiment in FIG. 11.
Figure 19B:
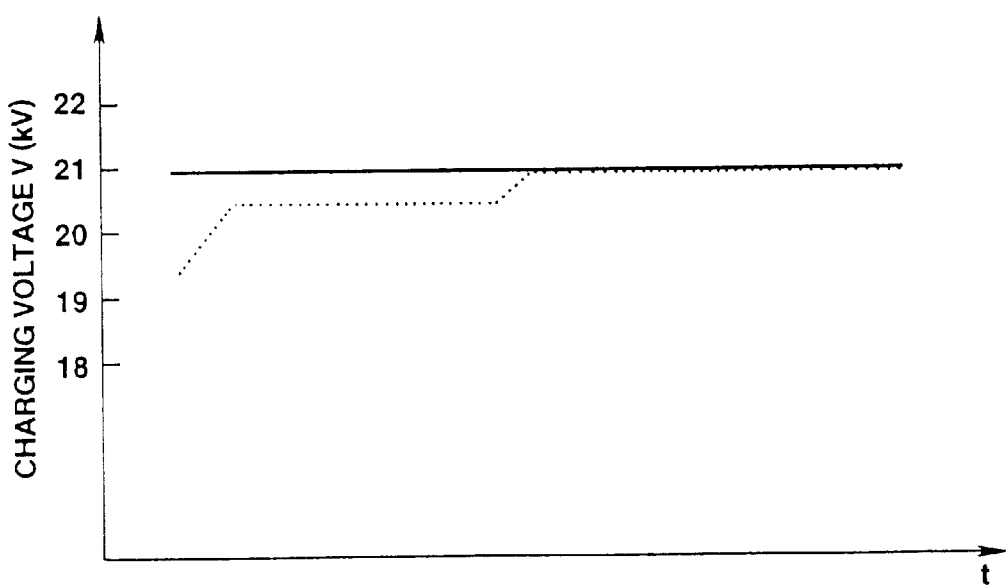

FIG. 19 shows the results of an experiment of charging voltage control with the embodiment in FIG. 1. All pulse energy values can be to agree as shown in FIG. 19 (*a*) through the provision of the charging voltage as shown in FIG. 19 (*b*).

Next, the control of excitation intensity (charging voltage control) when effecting semiconductor exposure using the step and scan system is explained with reference to FIGS. 20 to 22.

In other words, as shown in FIG. 4 before, a plurality of IC chips (21-1), (21-1), . . . are arranged on a semiconductor wafer (21); in the step and scan system, the exposure process is effected while the laser beam or the wafer (21) is moved. For this reason, in the step and scan system, the exposure range for one IC chip can be greater, than with a stepper to effect exposure processing with a fixed laser beam, and it is possible to effect exposure processing of a chip with a large area.

Figure 22:
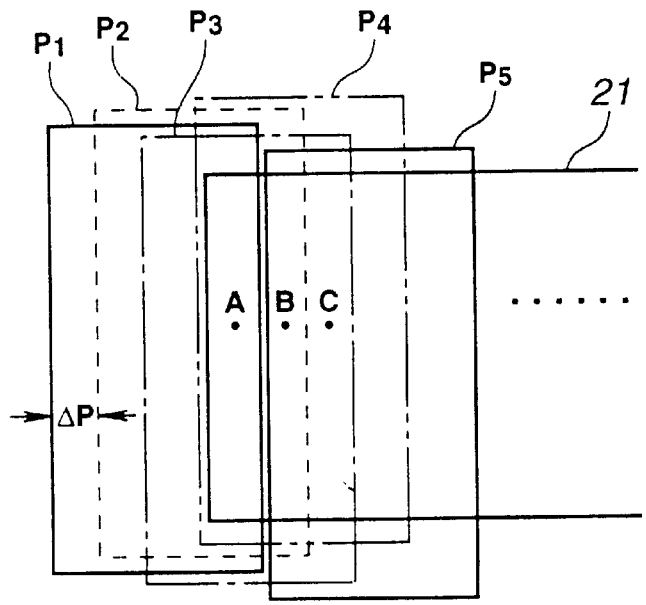
FIG. 22 is a diagram to show the irradiation mode of the pulse laser beam for the IC chip in the step and scan system.

Here, with a usual step and scan system, the laser beam irradiation area (area shown with P1, P2, P3 . . . ) is smaller than the area of the IC chip (21) as shown in FIG. 22. These pulse laser beams are scanned at a prescribed pitch ΔP in order and the exposure of the entire surface of the IC chip (21) is effected.

In the step and scan system, the scanning pitch ΔP and the irradiation area of the pulse laser are established so that a predetermined and prescribed number NO of pulse lasers irradiate all points on the machined object. If the pulse energy of each pulse is thereby the same as the target value Pd, the desired exposure (Pd×NO) can be attained for each point on the machined object from the irradiation of NO pulse laser beams.

Actually, the energy of each pulse varies, and it is necessary to deal with that phenomenon. In this embodiment, that problem is resolved with the control procedure shown in the flow chart in FIGS. 20 and 21.

For example, in FIG. 22, NO=4 and point A is exposed by the cumulative energy of four pulse laser beams P1, P2, P3, and P4; also, point B is exposed by the cumulative energy of four pulse laser beams P2, P3, P4, and P5. The subsequent points C, are exposed by the cumulative energy of four pulse laser beams in the same way.

Consequently, in the step and scan system, it is necessary to control each pulse energy value so that the shifting cumulative exposure of each point (for example, shifting cumulative exposure of point A is P1+P2+P3+P4) becomes equal.

Figure 20:
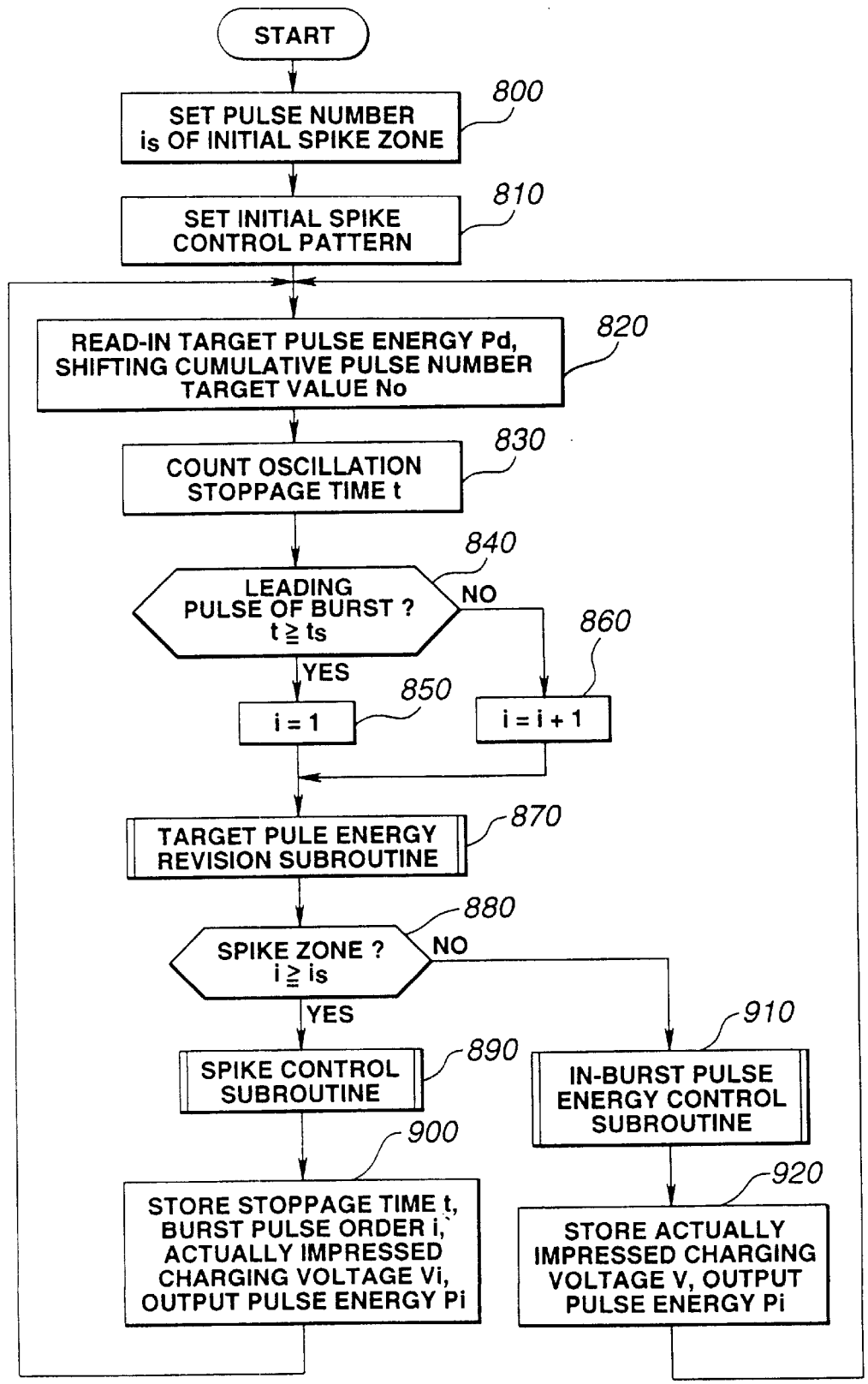
FIG. 20 is a flow chart to show the control procedures for another mode of the present invention.

The control for that purpose is shown in the target pulse energy revision subroutine of Step 870 in the flow chart in FIG. 20.

Figure 21:
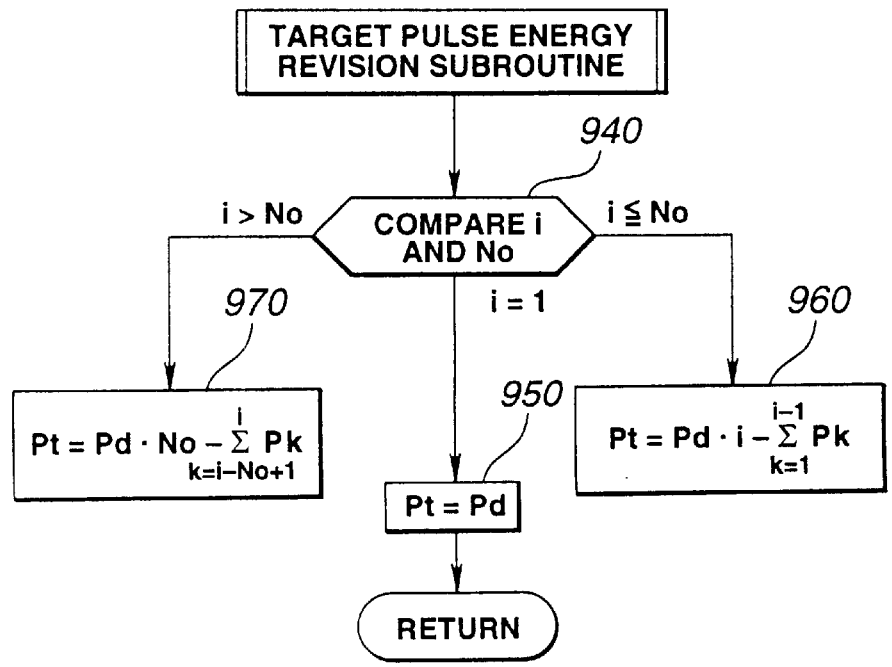
FIG. 21 is a flow chart to show the target pulse energy revision subroutine in the flow chart in FIG. 20.

Below, the control procedures shown in FIGS. 20 and 21 are explained.

The laser controller (6) sets the pulse number is of the initial spike zone where spike control must be performed (Step 800).

Next, the laser controller (6) sets the charging voltage pattern (initial spike control pattern) to be provided at the time of the initial is pulse oscillation which was determined at the time of the first continuous pulse oscillation (Step 810).

Next, the laser controller (6) reads in the target pulse energy Pd provided from the exposure apparatus controller (13) and the target value NO of the number of shifting cumulative pulses (Step 820) and then starts the timing of the oscillation stoppage time (reception interval of the trigger signal TR) t (Step 830).

Next, when the external trigger TR is input from the exposure apparatus controller (13), the laser controller (6) determines whether this external trigger TR which was input is the first external trigger (Step 840).

When the laser controller (6) determines that the trigger signal TR input this time is the first pulse, the laser controller (6) sets i=1 (Step 850) and then executes the revision subroutine for the target pulse energy (Step 870).

The procedures as shown in FIG. 21 are executed in this target pulse energy revision subroutine.

In other words, the current i value (this i is the value of the count of the total number of oscillations following the start of the pulse oscillation in one continuous pulse oscillation) is compared to the target value NO of the number of shifting cumulative pulses (Step 940). In the case where i=1, the target pulse energy Pt following revision is output as the target pulse energy Pd which was set previously (Step 950). In the case where i≦NO, the target pulse energy Pt following revision is calculated according to the following formula (1) (Step 960).

$$Pt = Pd \times i - \sum_{k=1}^{i-1} Pk \tag{1}$$

Also, in the case where i>NO, the target pulse energy Pt following revision is calculated according to the following formula (2) (Step 970).

$$Pt = Pd \times NO - \sum_{k=i-NO+1}^{i} Pk \tag{2}$$

Moreover, in these formulas, Pk is the pulse energy value actually monitored at the time of each pulse oscillation.

In other words, in the formula (1), the real exposure P1+P2+Pi−1 due to laser oscillation up to number (i−1) is subtracted from the target value (ideal value ) Pd×i when exposure up to number i was effected, and the remainder is calculated as the target value Pt when effecting number i laser oscillation; such a revision calculation is executed while i≦NO.

This formula (1) is a formula for a calculation to revise point A in FIG. 22.

The procedure in formula (2) is a formula for a calculation to revise the target energy in the case where i>NO. This is the formula for a calculation to revise point B and later (point B and points in the zone to the right of B) in FIG. 22.

When this type of target pulse energy revision subroutine is complete, it is determined whether the current point is in the spike zone (Step 880) by comparing i with the pulse number is which was set at the start of the spike zone. In the case where it was determined to be the spike zone, the laser controller (6) executes the spike control subroutine in Step 890.

In this spike control subroutine, action is the same as shown in FIGS. 12 to 14 above. Data, wherein the burst pulse number i is the same, and the oscillation stoppage time t is the same or closest, is extracted from old data; and from this extracted data, charging voltage data and pulse energy data having the pulse energy P closest to the target energy Pt are read. Using the pulse energy data and charging voltage data which were read, charging voltage value V, to set the pulse energy to the revised target value Pt, is calculated and laser oscillation according to the calculated charging voltage value is executed.

When this type of spike control subroutine is complete, the laser controller (6) takes the current pulse energy value Pi from the beam monitor module (8) and stores this pulse energy value Pi in the prescribed memory table, along with the current oscillation stoppage time t, burst pulse order i, and the charging voltage value V which was actually impressed (Step 900). In the same way as below, the procedures from step 820 to Step 900 are repeated until i=is, in other words, until the spike zone is finished.

When the spike control is completed in this way, the laser controller (6) executes the in-burst pulse energy control subroutine in the plateau zone and stable zone where i>is (Step 190). In this in-burst pulse energy control subroutine, the same type of action as in FIGS. 15 to 17 above is taken. The pulse energy value Pi of a pulse already output in the current burst period and the charging voltage at that time are read. Using the charging voltage V and the pulse energy value P which were read, the charging voltage value V, to set the pulse energy to the target value Pt, is calculated and laser oscillation is executed according to the calculated charging voltage value.

When this type of in-burst pulse energy control subroutine is complete, the laser controller (6) stores the currently impressed charging voltage Vi and the monitor value Pi of that laser output in the prescribed memory table (Step 920).

In the laser controller (6), this type of processing is repeated until the continuous pulse oscillation of the current burst period is complete.

Moreover, in the case where the laser apparatus of the present invention is used as the light source for the exposure apparatus, the control procedures in FIGS. 20 and 21 can also be applied in the case where the exposure apparatus is a stepper and not only in the case where it is the step and scan system.

Specifically, in the stepper system, the target energy Pt when oscillating each pulse laser beam may be calculated according to the following formula and the calculated target energy Pt may be changed to the set target value Pd and output, in the case where the number of beam pulses to irradiate one IC chip is NO, the target value of each pulse laser beam is Pd, the pulse energy value actually monitored at the time of each pulse oscillation is Pk ($1 \leq k \leq NO$), and the order of the pulse laser beams output successively is i.

In the case where i=1, $$Pt = Pd$$

In the case where i>1, $$Pt = Pd \times i - \sum_{k=1}^{i-1} Pk$$

With such an embodiment, in the stepper system, the real exposure due to the preceding pulse laser beams is subtracted from the ideal value of exposure at each point in time and the result of the subtraction is set to the target value of pulse energy at the time of the current laser pulse oscillation; therefore, the target value of pulse energy for each pulse oscillation is converted to a value essentially closer to the ideal in order to make each pulse energy uniform; and thereby the uniformity of each pulse energy can be contrived. Of course, through the addition of this revision calculation of the target pulse energy to the control procedure shown in FIG. 1, a revision calculation of target pulse energy may be effected, along with spike control and in-burst pulse energy control. Thereby, more uniformity of each pulse energy can be contrived in the stepper system.

INDUSTRIAL APPLICABILITY

As explained above, for each oscillation of one pulse in a succession of pulse oscillations, source voltage of a pulse having the same identifier of that pulse is read from a storage means and pulse oscillation is effected based on this source voltage with the present invention. Accordingly, in the case where all pulse oscillation for one machined object is completed with one cycle of burst mode operation, the source voltage which is read is data from pulse oscillation at the same position on the previous machined object. This data has an excitation intensity pattern influenced by a series of successive pulse oscillations. Specifically, variations of pulse energy during pulse oscillation can be more precisely resolved because of the application of source voltage having the excitation intensity pattern with the same characteristics as the previous time. Consequently, the precision of machining with laser beams can be further improved since the influence of the spiking phenomenon during burst mode operation can be eliminated as much as possible.

Also, with the present invention, sufficient suppression of variations in pulse energy can be attained for all pulses in continuous pulse oscillation and high precision laser beam machining can be realized, because the spike killer control is executed in the spike zone and source voltage control according to previous pulse oscillation circumstances is executed in subsequent zones. Furthermore, with the present invention, the amount of stored data can be reduced and the memory capacity decreased and moreover, data reading from memory at a higher speed becomes possible because spike killer control is executed only in the spike zone.

Also, with the present invention, the exposure at each point on a machined object can be uniform and high precision laser beam machining can be realized in a laser beam machining apparatus using the step and scan system, because the real exposure by the preceding pulse laser beams is subtracted from an ideal value of exposure at each time and the result of subtraction is made the target value of the pulse energy at the time of each laser pulse oscillation, in a laser apparatus to output continuously pulse laser beams for a machining apparatus to execute machining while the irradiation zone of a pulse laser on the machined object is displaced by a prescribed pitch each time a pulse laser is irradiated, so that a predetermined, prescribed number of pulse lasers irradiate all points on a machined object.

We claim:

1. A laser apparatus which effects a burst mode operation having as one cycle an operation of switching at a prescribed frequency between a continuous oscillation action for continuous pulse oscillation of a laser beam at a prescribed frequency and a stoppage action for stopping the pulse oscillation for a prescribed time, and controls a source voltage in such a manner that an energy output in the pulse oscillation reaches a prescribed magnitude, characterized in that the apparatus comprises:

storage means for storing the source voltage of each pulse when effecting the continuous pulse oscillation in association with identifiers specific to each pulse for one cycle's worth; and output control means, when oscillating one pulse, for reading out a source voltage of a pulse having the same identifier as that one pulse from the storage means and effecting the pulse oscillation based on the read-out source voltage.

2. The laser apparatus according to claim 1, wherein in the storage means, the source voltage and an output energy of each pulse of the time when effecting the continuous pulse oscillation are stored for one cycle in association with the identifier specific to each pulse, and detection of a real output energy of an oscillated pulse is effected whenever one pulse is oscillated, reading of an output energy of a pulse having the same identifier of the oscillated pulse from the storage means is effected, and revision of a value of the source voltage having the same identifier as the oscillated pulse is effected when a difference between both exceeds a prescribed range.

3. The laser apparatus according to claim 1, wherein the laser apparatus receives a trigger signal for instructing one pulse oscillation, counts a timing a reception interval of the trigger signal, finds the reception interval whenever the trigger signal is received; and controls the pulse oscillation in accordance with the reception interval.

4. The laser apparatus according to claim 1, wherein the laser apparatus receives a first trigger signal for instructing one pulse oscillation, a second trigger signal for instructing the continuous pulse oscillation and a third trigger signal for instructing a completion of one cycle, and controls the pulse oscillation in accordance with the received trigger signal.

5. The laser apparatus according to claim 1, wherein the laser apparatus counts the pulse number of a succession of pulse oscillations and controls the pulse oscillation in accordance wit h the count number.

6. A laser apparatus which effects a burst mode operation having as one burst cycle an operation of switching at a prescribed frequency between a continuous oscillation action for continuous pulse oscillation of a laser beam at a prescribed frequency and a stoppage action for stopping the pulse oscillation for a prescribed time, and controls an excitation intensity of the laser in such a manner that an energy output in the pulse oscillation reaches a prescribed magnitude, characterized in that the apparatus comprises:

storing means for storing a source voltage at a time of each pulse oscillation, in correlation to an oscillation stoppage time, a pulse order within one burst cycle, and a monitor value of an output pulse energy, with respect to each of a prescribed number of initial pulses when effecting the continuous oscillation action, and storing an excitation intensity during each pulse oscillation in correlation to a monitor value of the output pulse energy, with respect to each pulse generated after the prescribed number of initial pulses;

first source voltage control means which makes a reading of at least one set of a monitor value of an output pulse energy approaching a target pulse energy of the current pulse oscillation and an excitation intensity of that pulse, where the oscillation stoppage time and the pulse order within one burst cycle are the same, from among data of past pulse oscillations stored in the storage means, with respect to each of the prescribed number of initial pulses when effecting the continuous pulse oscillation, calculates an excitation intensity during the current pulse oscillation based on the read value, and effects the pulse oscillation based on the calculated excitation intensity value; and second source voltage control means which makes a reading of a pulse energy monitor value of a pulse already output within the current burst period and the excitation intensity of that pulse, from the storage means, with respect to each pulse generated after the prescribed number of initial pulses when effecting the continuous pulse oscillation, calculates an excitation intensity during the current pulse oscillation based on these values, and effects the pulse oscillation based on the calculated excitation intensity.

7. The laser apparatus according to claim 6, wherein the first source voltage control means reads out two sets of a monitor value of an output pulse energy closest to the target pulse energy of the current pulse oscillation and an excitation intensity at that time, and calculates the excitation intensity value at the time of the current pulse oscillation with an interpolation calculation using the two sets of excitation intensity values.

8. The laser apparatus according to claim 6, wherein the first source voltage control means reads out one set of a monitor value of an output pulse energy closest to the target pulse energy of the current pulse oscillation and an excitation intensity at that time, and calculates the excitation intensity value at the time of the current pulse oscillation by changing the read-out excitation intensity according to a result of comparing the target pulse energy value and a monitor value of the read-out output pulse energy.

9. A laser apparatus which continuously outputs a prescribed number Nt (NO<Nt) only of pulse laser beams necessary for machining an object to be machined, for a machining apparatus to effect machining while an irradiation zone of a pulse laser beam on the object is displaced by a prescribed pitch each time a pulse laser is irradiated, so that a preset, prescribed number NO of pulse lasers are irradiated onto all points on the object, characterized in that the apparatus comprises:

pulse energy detecting means for detecting a pulse energy $Pk$ ($k=1, 2, \ldots, Nt$) of an output pulse laser beam whenever each pulse laser beam is oscillated; and target pulse energy revising means, when a set target value of each pulse laser is Pd and an order of pulse laser beams output continuously is i, for calculating a target energy Pt at a time when each of the pulse laser beams is oscillated according to the following formula, changing the calculated target energy Pt to the set target value Pd and outputting that value, whenever each of the pulse laser beams is oscillated, in the case where i=1, Pt=Pd in the case where $i \leq NO$, $$Pt = Pd \times i - \sum_{k=1}^{i-1} Pk$$

in the case where i>NO $$Pt = Pd \times NO - \sum_{k=i-No+1}^{i} Pk.$$

10. A laser apparatus which continuously outputs a pulse laser beam for a machining apparatus to effect a prescribed machining by irradiating a preset, prescribed number NO of pulse lasers to an object to be machined with an irradiation zone of the pulse laser beams being fixed, characterized in that the apparatus comprises:

pulse energy detecting means for detecting an energy Pk (k=1, 2, . . . , No) of an output pulse laser beam whenever each laser beam is oscillated; and target pulse energy revising means, when a set target value of each pulse laser is Pd and an order of pulse laser beams output continuously is i, for calculating a target energy Pt at a time when each of the pulse laser beams is oscillated according to the following formula, changing the calculated target energy Pt to the set target value Pd and outputting that value, whenever each of the pulse laser beams is oscillated, in the case where i=1, Pt=Pd in the case where i>1, $$Pt = Pd \times i - \sum_{k=1}^{i-1} Pk.$$

* * * * *